US012652904B2

(12) United States Patent
Tsubuku et al.

(10) Patent No.: US 12,652,904 B2
(45) Date of Patent: Jun. 9, 2026

(54) DISPLAY DEVICE HAVING OPTIMIZED RATIOS OF CHANNEL WIDTH TO CHANNEL LENGTH OF TRANSISTORS

(71) Applicant: Magnolia White Corporation, Tokyo (JP)

(72) Inventors: Masashi Tsubuku, Tokyo (JP); Takeshi Sakai, Tokyo (JP); Kentaro Miura, Tokyo (JP); Hajime Watakabe, Tokyo (JP); Takaya Tamaru, Tokyo (JP); Hiroshi Tabatake, Tokyo (JP); Yutaka Umeda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 612 days.

(21) Appl. No.: 18/176,503

(22) Filed: Mar. 1, 2023

(65) Prior Publication Data

US 2023/0292551 A1     Sep. 14, 2023

(30) Foreign Application Priority Data

Mar. 9, 2022     (JP) ................................. 2022-036594

(51) Int. Cl.
*H10K 59/12*        (2023.01)
*H10K 59/121*       (2023.01)
*H10D 86/40*        (2025.01)
*H10D 86/60*        (2025.01)

(52) U.S. Cl.
CPC ....... *H10K 59/1213* (2023.02); *H10D 86/481* (2025.01); *H10D 86/60* (2025.01)

(58) Field of Classification Search
CPC ... H10K 59/1213; H10D 86/60; H10D 86/481
USPC .......................................................... 257/71
See application file for complete search history.

(56) References Cited

U.S. PATENT DOCUMENTS

| | | | |
|---|---|---|---|
| 11,587,957 B2 * | 2/2023 | Kimura .............. | H10K 59/1213 |
| 2013/0299819 A1 | 11/2013 | Yamazaki et al. | |
| 2019/0116327 A1 * | 4/2019 | Shouho .................. | H04N 25/67 |

FOREIGN PATENT DOCUMENTS

| | | | | |
|---|---|---|---|---|
| CN | 110534052 A | * | 12/2019 | ........... G09G 3/3674 |
| CN | 107592079 B | * | 3/2021 | ......... H03F 3/45179 |
| CN | 113948002 A | * | 1/2022 | ......... H10K 59/8731 |
| JP | 2013-254950 A | | 12/2013 | |
| WO | WO-2018157589 A1 | * | 9/2018 | ........... G09G 3/3677 |

* cited by examiner

*Primary Examiner* — Phuc T Dang
(74) *Attorney, Agent, or Firm* — XSENSUS LLP

(57)        ABSTRACT

A display device includes a light-emitting element; a first transistor and a second transistor connected in series between the light-emitting element and a driving power line; a third transistor electrically connected to a gate electrode of the first transistor; and a fourth transistor connected in parallel between a drain electrode of the first transistor and the light-emitting element, wherein a ratio of a channel width W1 to a channel length L1 of the first transistor (a W1/L1 ratio) and a ratio of a channel width W2 to a channel length L2 of the second transistor (a W2/L2 ratio) are larger than a ratio of a channel width W3 to a channel length L3 of the third transistor (a W3/L3 ratio) and a ratio of a channel width W4 to a channel length L4 of the fourth transistor (a W4/L4 ratio).

20 Claims, 22 Drawing Sheets

100

VL  SLa                                                 102        101

Sgb
103                                                         SLb

DISPLAY DEVICE HAVING OPTIMIZED RATIOS OF CHANNEL WIDTH TO CHANNEL LENGTH OF TRANSISTORS

CROSS-REFERENCE TO RELATED APPLICATION

This application claims the benefit of priority to Japanese Patent Application No. 2022-036594, filed on Mar. 9, 2022, the entire contents of which are incorporated herein by reference.

FIELD

An embodiment of the present invention relates to a display device. In particular, the preset invention relates to a structure of pixels of the display device.

BACKGROUND

An organic electroluminescence (hereinafter, referred to as an organic EL) display device has been actively studied because of its advantages such as wide viewing angle, high-speed response, and usability as a sheet display. A light-emitting element is arranged for each pixel of the organic EL display device, and an image is displayed by individually controlling the light emission. The light-emitting element has a structure in which a layer (hereinafter, also referred to as "light-emitting layer") containing an organic EL material is sandwiched between a pair of electrodes distinguished from each other by one being an anode and the other being a cathode. When an electron is injected into the light-emitting layer from the cathode and a positive hole is injected from the anode, the electron and the positive hole recombine with each other. The extra energy released thereby excites light-emitting molecules in the light-emitting layer and then de-excites them to emit light.

In recent years, an oxide semiconductor (Oxide Semiconductor; OS) has attracted attention as a semiconductor layer forming an organic EL display device. A transistor using the oxide semiconductor layer is expected to be applied to a low-power display device because of its low off-leakage current and its low-frequency driving. In particular, power consumption is greatly reduced by applying a transistor using the oxide semiconductor layer to a self-luminous organic EL display device (Japanese laid-open Patent Publication No. 2013-254950).

SUMMARY

A display device according to an embodiment of the present invention includes a light-emitting element; a first transistor and a second transistor connected in series between the light-emitting element and a driving power line; a third transistor electrically connected to a gate electrode of the first transistor; and a fourth transistor connected in parallel between a drain electrode of the first transistor and the light-emitting element, wherein a ratio of a channel width W1 to a channel length L1 of the first transistor (a W1/L1 ratio) and a ratio of a channel width W2 to a channel length L2 of the second transistor (a W2/L2 ratio) are larger than a ratio of a channel width W3 to a channel length L3 of the third transistor (a W3/L3 ratio) and a ratio of a channel width W4 to a channel length L4 of the fourth transistor (a W4/L4 ratio).

BRIEF DESCRIPTION OF DRAWINGS

FIG. 5 is an equivalent circuit diagram of a pixel included in a display device according to an embodiment of the present invention.

DESCRIPTION OF EMBODIMENTS

Hereinafter, embodiments of the present invention will be described with reference to the drawings and the like. However, the present invention can be implemented in various forms without departing from the gist of the present invention, and is not to be construed as being limited to the description of the embodiments illustrated below. In addition, in order to make the description clearer with respect to the drawings, the width, thickness, shape, and the like of each part may be shown schematically as compared to actual embodiments, but the schematic drawings are merely examples, and do not limit the interpretation of the present invention. Furthermore, in the present specification and the drawings, the same or similar elements as those described in respect to the above-described drawings are denoted by the same symbols, and redundant description may be omitted.

In the present invention, in the case where a single film is processed to form a plurality of films, the plurality of films may have different functions and roles. However, the plurality of films is derived from films formed as the same layer in the same process, and have the same layer structure and the same material. Therefore, the plurality of films is defined as being present in the same layer.

Note that the terms "above" and "below" in description of the drawings in represent specification express a relative positional relationship between a structure of interest and another structure. In the present specification, in a side view, a direction from a first substrate to a pixel electrode, which will be described later, is defined as "above", and a reverse direction thereof is defined as "below". In this specification and claims, the expression "on" in describing the manner of arranging another structure on a certain structure shall include both arranging another structure directly above a certain structure and arranging another structure over a certain structure via yet another structure, unless otherwise specified.

In this disclosure, bottom gate drive refers to the case when on/off is controlled by the gate electrode located below the semiconductor layer. In this disclosure, top gate drive refers to the case when on/off is controlled by a gate electrode located above the semiconductor layer. In this disclosure, dual gate drive refers to the case when on/off is controlled by inputting the same control signal to the gate electrodes located above and below the semiconductor layer.

First Embodiment

A display device 100 according to an embodiment of the present invention will be described with reference to FIG. 1 to FIG. 4.

Figure 1:
FIG. 1 is a plan view illustrating a structure of a display device according to an embodiment of the present invention.

FIG. 1 is a plan view illustrating a structure of the display device 100 according to an embodiment of the present invention. As shown in FIG. 1, the display device 100 includes a display area 102 and a peripheral area 109 arranged on a substrate 101.

The display area 102 includes a plurality of pixels 103 arranged in a matrix. Each of the plurality of pixels 103 includes a plurality of transistors and light-emitting elements.

The peripheral area 109 is arranged to surround the display area 102. The peripheral area 109 in the substrate 101 refers to an area from the display area 102 to an end portion of the substrate 101. In other words, the peripheral area 109 is an area on the substrate 101 other than where the display area 102 is provided (i.e., an area outside of the display area 102). The peripheral area 109 includes gate driving circuits 104_1 and 104_2 and a terminal portion 107 including a plurality of terminals 106. The gate driving circuits 104_1 and 104_2 are arranged so as to sandwich the display area 102. The driver IC 105 is in the form of an IC chip and is arranged on a flexible printed circuit 108. The flexible printed circuit 108 is connected to the plurality of terminals 106. In FIG. 1, although an example in which the driver IC 105 includes a source driving circuit, it is not limited to this structure, and a source driving circuit may be arranged separately from the driver IC 105 on the substrate 101. In addition, although an example in which the driver IC 105 is arranged on the flexible printed circuit 108, it is not limited to this form and may be arranged on the substrate 101.

The driver IC 105 is connected to the gate driving circuits 104_1 and 104_2 and a plurality of video signal lines VL. The gate driving circuit 104_1 or the gate driving circuit 104_2 is connected to the pixel 103 via a write control scanning line Sgb. Among the plurality of write control scanning lines Sgb, for example, the write control scanning line Sgb in an odd-numbered row is connected to the gate driving circuit 104_1, and the write control scanning line Sgb in an even-numbered row is connected to the gate driving circuit 104_2. The video signal line VL is connected to the pixel 103. A control signal SG for selecting each pixel 103 is applied to the display area 102 from the driver IC 105 via the gate driving circuits 104_1 and 104_2 and the write control scanning line Sgb. In addition, a video signal Vsig is applied to the display area 102 from the driver IC 105 via the video signal line VL. With these signals, the transistors included in the pixel 103 can be driven, and an image corresponding to the video signal Vsig can be displayed on the display area 102. In addition, each of a high potential power source SLa and a low potential power source electrode SLb connected to the pixel 103 is connected to different terminals 106.

A glass substrate or a flexible plastic substrate is used as the substrate 101. When a flexible plastic substrate is used as the substrate 101, an area between the display area 102 and the terminal portion 107 can be folded. This makes it possible to reduce the frame size of the display device 100.

<Equivalent Circuit Diagram>

Figure 2:
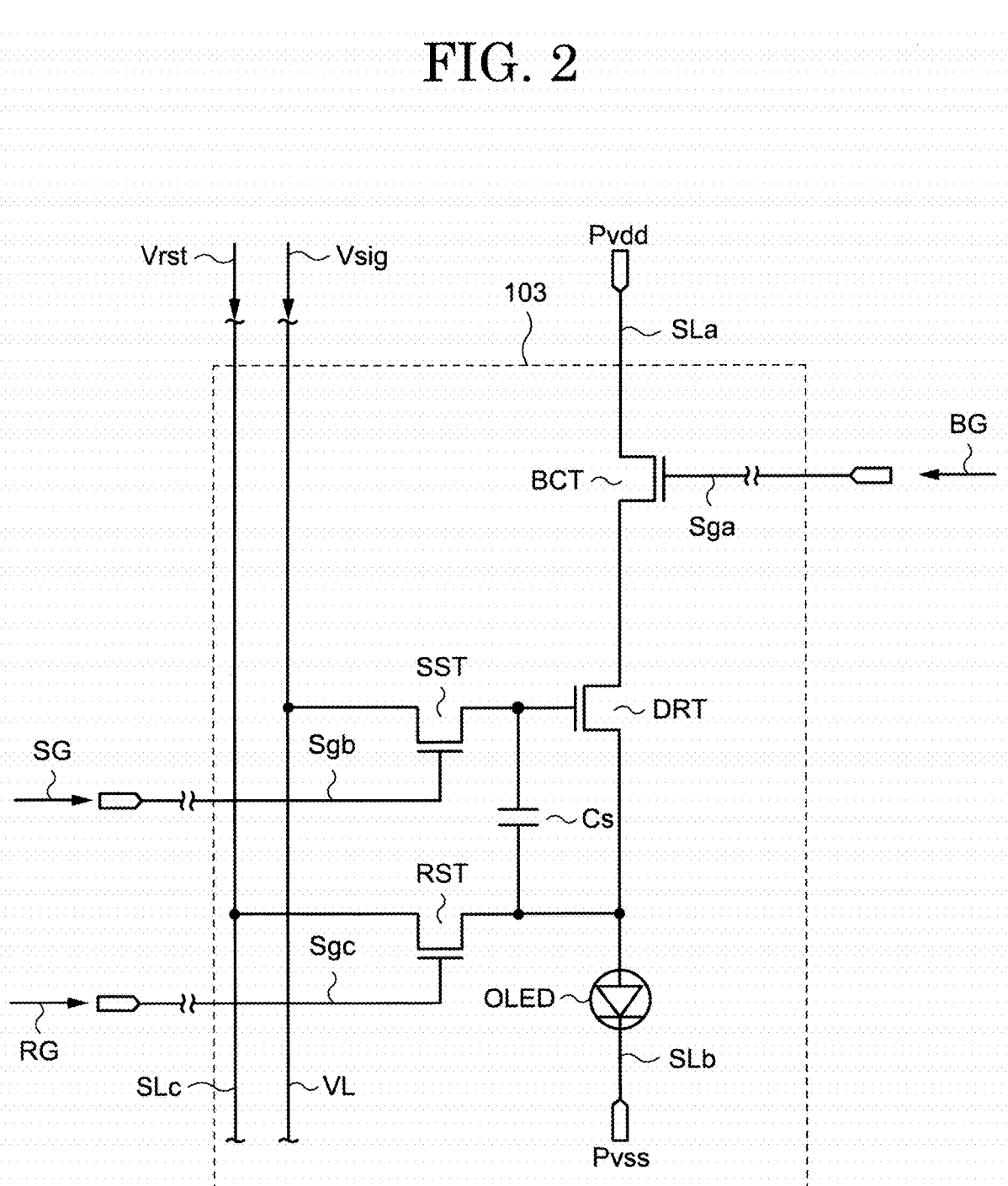
FIG. 2 is an equivalent circuit diagram of a pixel included in a display device according to an embodiment of the present invention.

FIG. 2 is an equivalent circuit diagram of the pixel 103 included in the display device 100 according to an exemplary embodiment. The display device 100 has the high potential power source SLa, the low potential power source electrode SLb, an emission control scanning lines Sga, the write control scanning line Sgb, the video signal line VL, and a reset power source line SLc. A high potential power source Pvdd is applied to the high potential power source SLa, and a low potential power source Pvss is applied to the low potential power source electrode SLb. The write control scanning line Sgb is connected to the gate driving circuits 104_1 and 104_2, and the video signal line VL and the reset power source line SLc are connected to the driver IC 105.

Each pixel 103 includes at least a driving transistor DRT (also referred to as a first transistor), an output transistor BCT (also referred to as a second transistor), a writing transistor SST (also referred to as a third transistor), a rest transistor RST (also referred to as a fourth transistor), a holding capacitor Cs, and a light-emitting element OLED. Each of the writing transistor SST, the driving transistor DRT, the output transistor BCT, and the reset transistor RST has a first terminal, a second terminal, and a third terminal. In this disclosure, the first terminal is referred to as a source electrode, the second terminal is referred to as a drain electrode, and the third terminal is referred to as a gate electrode.

The high potential power source Pvdd is applied to an anode (also referred to as a pixel electrode) of the light-emitting element OLED and a low potential power source Pvss is applied to a cathode (also referred to as a common electrode) via the driving transistor DRT.

In the output transistor BCT, the source electrode is connected to the high potential power source SLa, the drain electrode is connected to the source electrode of the driving transistor DRT, and the gate electrode is connected to the emission control scanning line Sga. In the output transistor BCT, the ON state (conductive state) or the OFF state (non-conductive state) is controlled by the control signal BG from the light emission control scanning line Sga. The output transistor BCT controls the emission time of the light-emitting element OLED in response to a control signal BG.

In the writing transistor SST, the gate electrode is connected to the write control scanning line Sgb, the source electrode is connected to the video signal line VL, and the drain electrode is connected to the gate electrode of the drive transistor DRT. The writing transistor SST functions as a switching element that selects conduction or non-conduction between the two nodes and writes a voltage corresponding to the luminance of the light-emitting element OLED.

In the driving transistor DRT, the drain electrode is connected to the anode of the light-emitting element OLED, the source electrode is connected to the drain electrode of the output transistor BCT, and the gate electrode is connected to the drain electrode of the writing transistor SST and one of the holding capacitors Cs. In other words, the driving transistor DRT is connected in series with the light-emitting element OLED and the output transistor BCT between the high potential power supply SLa and the low potential power supply electrode SLb. The driving transistor DRT functions as a current control element that controls the current value flowing to the light-emitting element OLED according to the gate-source voltage. As a result, the driving transistor DRT outputs a drive current of a current amount corresponding to the video signal Vsig to the light-emitting element OLED.

In the reset transistor RST, the source electrode is connected to the reset power supply line SLc which is connected to a reset power supply, the drain electrode is connected to the other electrode of the holding capacitor Cs and the light-emitting element OLED, and the gate electrode is connected to a reset control scanning line Sgc which functions as a gate wiring for reset control. In other words, the drain of the reset transistor RST is connected to the gate of the driving transistor DRT via the holding capacitor Cs. The reset power source line SLc is connected to the reset power supply and fixed to the reset potential Vrst, which is a constant potential.

The reset transistor RST switches between the reset power source line SLc and the reset control scanning line Sgc to the ON or OFF state according to the control signal RG provided by the reset control scanning line Sgc. When the reset transistor RST is turned ON, the potential of the drain electrode of the driving transistor DRT is initialized.

A holding capacitor Cs may be provided between the gate and drain of the driving transistor DRT. The holding capacitor Cs holds the voltage between the gate and drain of the drive transistor DRT for a certain period of time.

For example, amorphous silicon, low-temperature polysilicon, or an oxide semiconductor is used as the semiconductor layer of the transistors constituting the display device 100. In this case, since each of the transistors using the oxide semiconductor layer has a low off-leakage current and can be driven at a low frequency, the display device 100 with low power consumption can be realized. In addition, each of the transistors using the oxide semiconductor layer has a better saturating property than a transistor including a low-temperature polysilicon layer because the kink effect is not observed. In the present embodiment, the case where the oxide semiconductor layer is used as the semiconductor layer of the transistor constituting the display device 100 will be described.

For example, a pixel using four transistors as shown in FIG. 2 has a long time in which a negative bias is applied to the writing transistor SST and the reset transistor RST, which are used to hold and reset the signal potential to drive at a low frequency. On the other hand, a positive bias is applied for a long time to the output transistor BCT and the driving transistor DRT, which control the current flowing to the light-emitting element OLED. When such a pixel is driven for a long time as a display device, the degree of degradation of the output transistor BCT and the driving transistor DRT is significantly different from that of the writing transistor SST and the reset transistor RST in the same pixel. In particular, it was found that the transistors that control the current flowing into the light-emitting element OLED, such as the output transistor BCT and the driving transistor DRT, have a large amount of positive drift in the threshold voltage. However, such variations in transistor characteristics are difficult to improve by adjusting the process of semiconductor manufacturing equipment (called process tuning).

The transistors using oxide semiconductor layers have different transistor characteristics due to a difference in the ratio between a channel width W and a channel length L (also called W/L ratio), even in the same process and on the same substrate. This is because the larger the channel width W of the transistor and the shorter the channel length L, the easier it is to create oxygen defects in the oxide semiconductor, which changes the Fermi level of the active layer. Basically, the closer the Fermi level is to the conductor, the less carrier trapping occurs in the gate dielectric, and therefore the amount of positive drift in the threshold voltage due to stress from the positive bias applied to the gate is smaller. On the other hand, the shorter the channel length L, the more negative drift of the threshold voltage occurs, called optical degradation. Therefore, simply increasing the W/L ratio of the transistor will result in a gradual negative drift of the threshold voltage. In this disclosure, the channel region refers to the area where the oxide semiconductor layer overlays the gate electrode. The channel length L refers to the length in the direction connecting the source and drain electrodes in the region where the oxide semiconductor layer overlaps the gate electrode. The channel width W refers to the length in the direction orthogonal to the channel length L in the region where the oxide semiconductor layer overlaps the gate electrode.

Therefore, in the display device 100 of an embodiment of the invention, a W/L ratio of a transistor used for emitting light of the light-emitting element OELD is larger than a W/L ratio of a transistor used for holding and resetting the charge of the capacitance in which the negative bias is dominant. In other words, in the pixel 103 shown in FIG. 2, the W/L ratios of the writing transistor SST and the reset transistor RST are made smaller, and the W/L ratios of the output transistor BCT and the driving transistor DRT are made larger. Specifically, the W/L ratios of the writing transistor SST and the reset transistor RST are less than 1.5, and the W/L ratios of the output transistor BCT and the driving transistor DRT are 1.5 or more. Preferably, the W/L ratios of the writing transistor SST and the reset transistor RST are 1.0 or less, and the W/L ratios of the output transistor BCT and driving transistor DRT are 2.0 or more.

This structure suppresses the negative drift of the threshold voltage of the transistors SST and RST used for holding and resetting the charge of the capacitors, while the transistors used for emitting light of the light-emitting element OLED can suppress the positive drift of the threshold voltage due to the stress caused by the positive bias applied to the gate. The amount of positive drift of the threshold voltage due to the voltage caused by the positive bias applied to the gate electrode of the transistor used for the light-emitting element OLED can be reduced. Therefore, the degradation of the transistor in the pixel 103 of the display device 100 can be suppressed. As a result, the reliability of the display device 100 can be improved.

<Planar Layout and Cross-Sectional View of Pixel>

Figure 3:
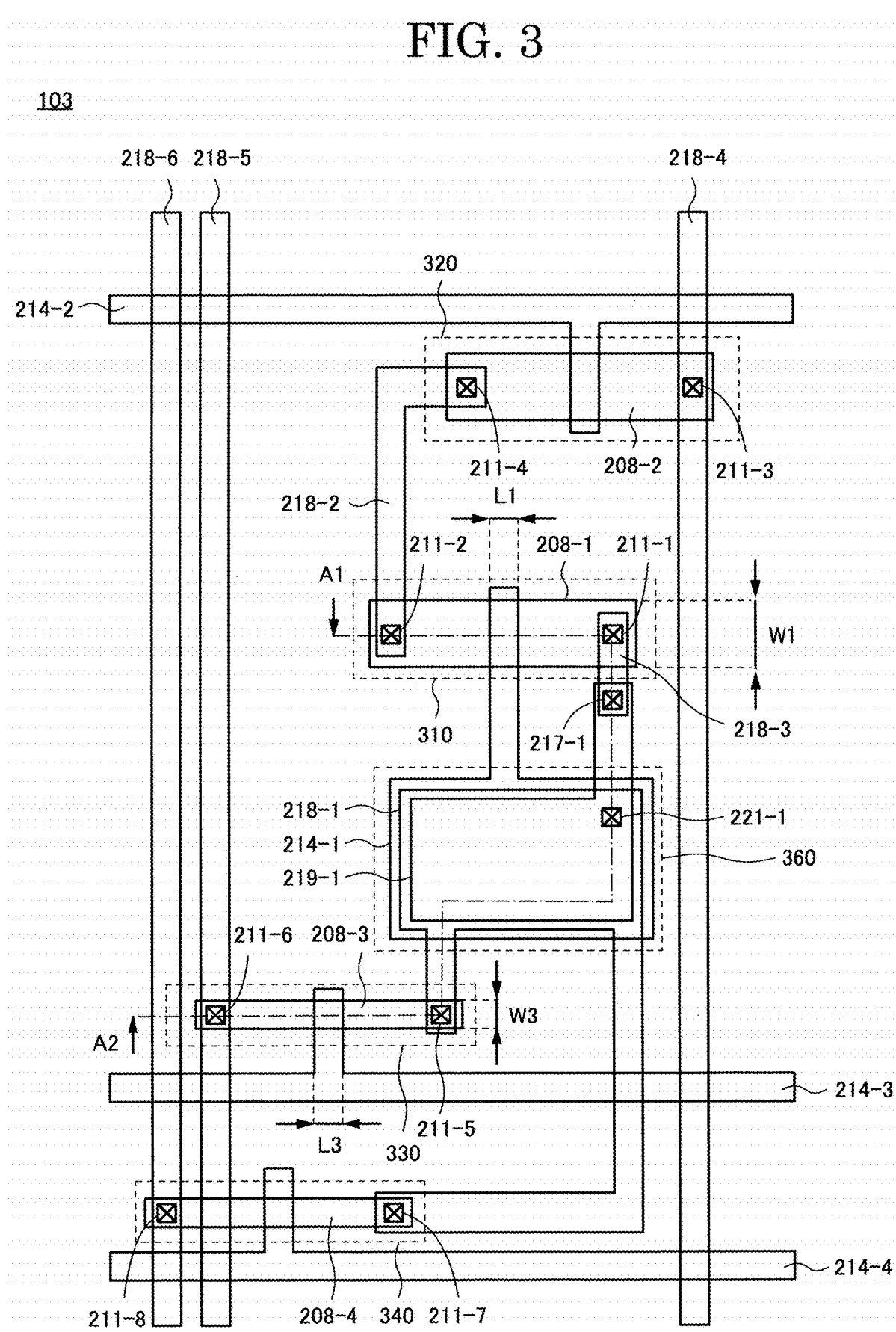
FIG. 3 is a planar layout diagram of a pixel of a display device according to an embodiment of the present invention.
Figure 4:
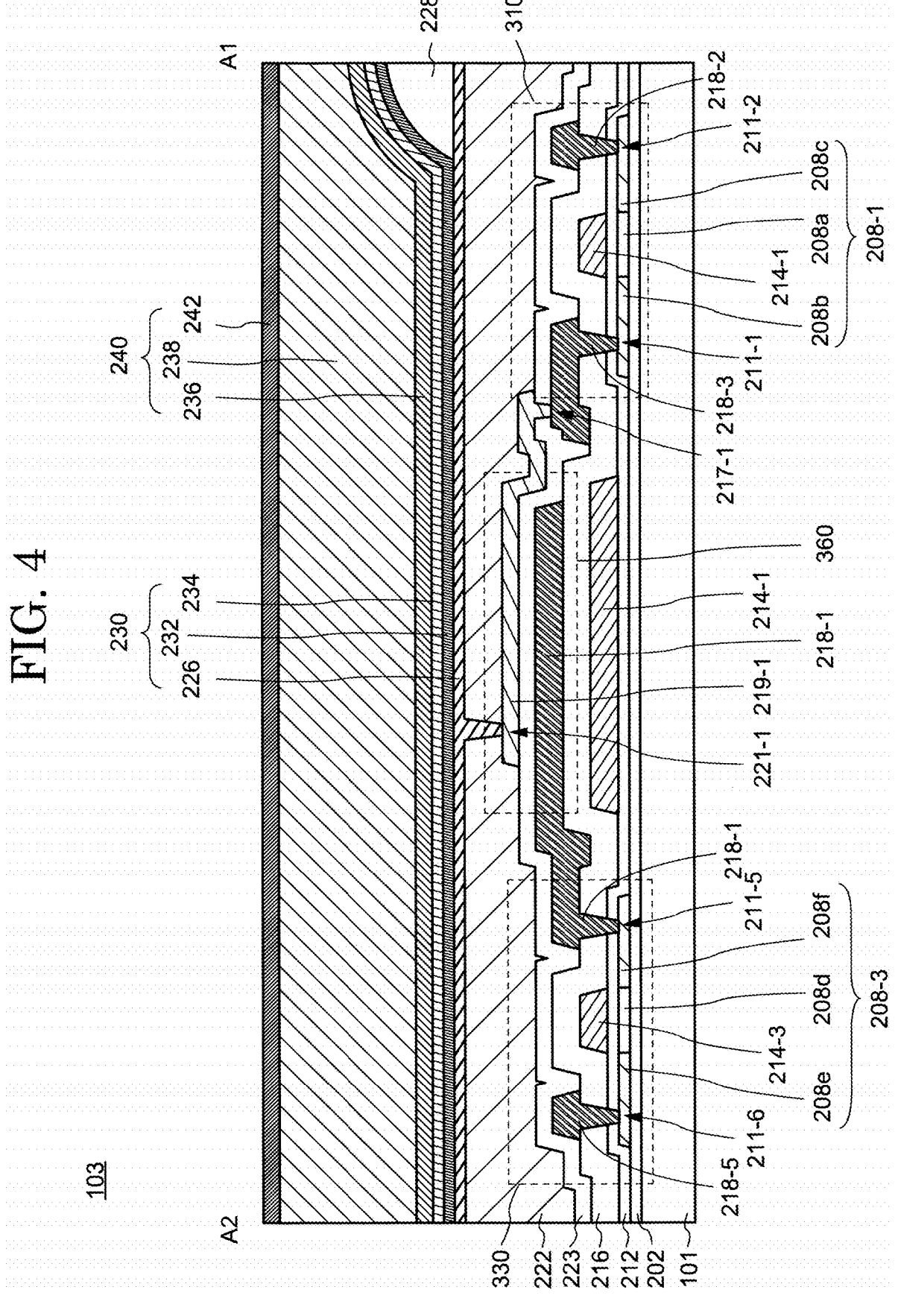
FIG. 4 is a cross-sectional structure of a pixel of a display device according to an embodiment of the present invention.

Next, a planar layout of pixel 103 and a cross-section of pixel 103 of the display device 100 according to an embodiment of the invention will be described with reference to FIG. 3 and FIG. 4. FIG. 3 is a planar layout of the pixel 103 of the display device 100 according to an embodiment of the invention. FIG. 4 is a cross-sectional view of the pixel 103 shown in FIG. 3 when cut along the line A1-A2.

As shown in FIG. 3, the pixel 103 includes transistors 310, 320, 330, and 340, and a holding capacitance 360. The transistor 310 corresponds to the driving transistor DRT. The transistor 320 corresponds to the output transistor BCT. The transistor 330 corresponds to the writing transistor SST. The transistor 340 corresponds to the reset transistor RST. The holding capacitor 360 corresponds to the holding capacitor Cs. The transistors 310 to 340 are all described as top gate driving transistors, but may be bottom gate driving transistors or dual gate driving transistors.

In FIG. 3, oxide semiconductor layers 208-1 to 208-4, conductive layers 214-1 to 214-4, conductive layers 218-1 to 218-6, a conductive layer 219-1, and contact holes 211-1 to 211-8, 217-1, and 221-1 are illustrated. In FIG. 3, insulating films such as a base film, a gate insulating film, an interlayer insulating film, and a planarization film are omitted. In FIG. 3, the layers above the conductive layer 219-1 are also omitted.

The transistor 310 has the oxide semiconductor layer 208-1, the conductive layer 214-1, and the conductive layers 218-2, 218-3, and the gate insulating film. The conductive layer 214-1 functions as a gate electrode in a region overlapping the oxide semiconductor layer 208-1. The oxide semiconductor layer 208-1 is connected to the conductive layers 218-2 and 218-3 via the contact holes 211-1 and 211-2 in the gate insulating film and the interlayer insulating film, respectively. Although not shown in FIG. 3, the oxide semiconductor layer 208-1 is electrically connected to the pixel electrode of the light-emitting element OLED via the conductive layer 218-3 and the conductive layer 219-1.

The transistor 320 has the oxide semiconductor layer 208-2, the conductive layer 214-2, the conductive layers 218-2, 218-4, and the gate insulating film. The conductive layer 214-2 functions as a gate electrode in a region overlapping the oxide semiconductor layer 208-2. The oxide semiconductor layer 208-2 is connected to the conductive layers 218-2 and 218-4 via the contact holes 211-3 and 211-4 provided in the gate insulating film and the interlayer insulating film. The transistor 320 is connected to the transistor 310 by the conductive layer 218-2.

The transistor 330 has the oxide semiconductor layer 208-3, the conductive layer 214-3, the conductive layers 218-1, 218-5, and the gate insulating film. The conductive layer 214-3 functions as a gate electrode in a region overlapping the oxide semiconductor layer 208-3. The oxide semiconductor layer 208-3 is connected to the conductive layers 218-1 and 218-5 via the contact holes 211-5 and 211-6 provided in the gate insulating film, respectively.

The transistor 340 has the oxide semiconductor layer 208-4, the conductive layer 214-4, the conductive layers 218-1 and 218-6, and the gate insulating film. The conductive layer 214-4 functions as a gate electrode in a region overlapping the oxide semiconductor layer 208-4. The oxide semiconductor layer 208-4 is connected to the conductive layers 218-1 and 218-6 via the contact holes 211-7 and 211-8 in the gate insulating film and the interlayer insulating film, respectively. The transistor 340 is connected to the transistor 330 via the conductive layer 218-1.

The holding capacitor 360 is made up of the conductive layer 218-1, the conductive layer 219-1, and the interlayer insulating film.

The transistor 310 has a channel width W1 and a channel length L1. The transistor 320 also has a channel width W2 and a channel length L2, although not shown in FIG. 3. The transistor 330 also has a channel width W3 and a channel length L3. The transistor 340 also has a channel width W4 and a channel length L4, although not shown in FIG. 3. The ratio of the channel width W and the channel length L of the transistor is described as the W/L ratio in this disclosure. For example, the ratio of the channel width W1 and the channel length L1 of the transistor 310 is described as the W1/L1 ratio. The W/L ratio of the transistors 320 to 340 is described in the same way as for transistor 310.

Comparing the transistor 310 and the transistor 330, the W1/L1 ratio of the transistor 310 is larger than the W3/L3 ratio of the transistor 330. For example, the W1/L1 ratio of the transistor 310 is 1.5 or more, while the W3/L3 ratio of the transistor 330 is less than 1.5. Comparing the transistor 320 and the transistor 330, the W2/L2 ratio of the transistor 320 is larger than the W3/L3 ratio of the transistor 330. For example, the W2/L2 ratio of the transistor 320 is 1.5 or more, while the W3/L3 ratio of the transistor 330 is less than 1.5. The W1/L1 ratio of the transistor 310 and the W2/L2 ratio of the transistor 320 may be the same or different.

Thus, the W1/L1 ratio of the transistor 310 and the W2/L2 ratio of the transistor 320 are larger than the W3/L3 ratio of the transistor 330 and the W4/L4 ratio of the transistor 340. This suppresses the negative drift of the threshold voltage of the transistors SST and the transistor RST used to hold and reset the charge of capacitor, and the transistor used for the light-emitting element OLED can reduce the amount of positive drift of the threshold voltage due to gate positive bias stress. Therefore, in the pixels of the display device, the degradation of the transistors can be suppressed. Therefore, the reliability of the display device can be improved.

As mentioned above, the W1/L1 ratio of the transistor 310 and the W2/L2 ratio of the transistor 320 may be 1.5 or more. Therefore, the W1/L1 ratio of the transistor 310 and the W2/L2 ratio of the transistor 320 may be the same or different.

The W3/L3 ratio of the transistor 330 and the W4/L4 ratio of the transistor 340 may be less than 1.5. Therefore, the W3/L3 ratio of the transistor 330 and the W4/L4 ratio of the transistor 340 may be the same or different. However, it is preferable for the W3/L3 ratio of the transistor 330 and the W4/L4 ratio of the transistor 340 to be the same because the stress applied to the transistor 330 and the transistor 340 is almost the same.

In this embodiment, the case in which the channel length L1 of the transistor 310 and the channel length L2 of the transistor 320, the channel length L3 of the transistor 330, and the channel length L4 of the transistor 340 are the same length is illustrated, but this embodiment of the invention is not limited. For example, the channel length L1 of the transistor 310 may be different from the channel length L3 of the transistor 330 and the channel length L4 of the transistor 340. In particular, the channel length L1 of the transistor 310 may be longer than the channel length L3 of the transistor 330 and the channel length L4 of the transistor 340. By increasing the channel length L1 of the transistor 310, the S value can be increased.

<Cross-Sectional Structure of Pixel>

FIG. 4 illustrates the cross-sectional structure of the pixel 103 of the display device 100 according to an embodiment of the invention. As shown in FIG. 4, the transistor 310 and the transistor 330 are arranged on the substrate 101 via an insulating film 202. The transistor 310 is connected to the light-emitting element 230. Here, the transistor 310 corresponds to the driving transistor DRT, the transistor 330 corresponds to the writing transistor SST, and the light-emitting element 230 corresponds to the light-emitting element OLED.

The transistor 310 includes the oxide semiconductor layer 208-1 arranged on the insulating film 202, an insulating film 212 arranged on the oxide semiconductor layer 208-1, the conductive layer 214-1 arranged on the insulating film 212, and the conductive layers 218-2 and 218-3 arranged on an insulating film 216. Here, the oxide semiconductor layer 208-1 includes a channel region 208a and impurity regions 208b and 208c. The channel region 208a is arranged between the impurity region 208b and the impurity region 208c. The channel region 208a in the oxide semiconductor layer 208-1 is a region overlapping the conductive layer 214-1. The insulating film 212 functions as the gate insulating film of the transistor 310. The insulating film 216 is arranged on the conductive layer 214-1. The insulating film 216 functions as an interlayer insulating film. The conductive layers 218-2 and 218-3 function as source or drain electrodes, respectively. The conductive layer 218-2 is connected to the impurity region 208c via the contact hole 211-2 in the insulating films 212 and 216. The conductive layer 218-3 is connected to the impurity region 208b via the contact hole 211-1 provided in the insulating films 212 and 216. The conductive layer 218-3 is connected to the conductive layer 219-1 via the contact hole 217-1 in an insulating film 223.

The transistor 330 has the oxide semiconductor layer 208-3 arranged on the insulating film 202, the insulating film 212 arranged on the oxide semiconductor layer 208-3, the conductive layer 214-3 arranged on the insulating film 212, and the conductive layers 218-1 and 218-5 arranged on the insulating film 216. The insulating film 212 functions as a gate insulating film. The oxide semiconductor layer 208-3 includes a channel region 208d and impurity regions 208e and 208f. The channel region 208d is arranged between the impurity regions 208e and 208f. Here, the channel region 208d is a region overlapping the conductive layer 214-3 in the oxide semiconductor layer 208-3. The insulating film 216 is arranged on the conductive layer 214-3. The insulating film 216 functions as an interlayer insulating film. The conductive layers 218-1 and 218-5 function as source and drain electrodes, respectively. The conductive layer 218-1 is connected to the impurity region 208f via the contact hole 211-5 in the insulating films 212 and 216. The conductive layer 218-5 is connected to the impurity region 208e via the contact holes 211-6 provided in the insulating films 212 and 216.

Although not shown in FIG. 4, in this embodiment, the transistors 320 and 340 have top-gate structure same as that of transistor 310. In an embodiment of the present invention, without limitation, the transistors 320 and 340 may have a different structure than the transistor 310.

The conductive layer 218-1, the insulating film 223, and the conductive layer 219-1 on the insulating film 212 constitute the holding capacitor 360.

A planarization film 222 is arranged on the conductive layer 219-1. The planarization film 222 is arranged to mitigate unevenness caused by the transistors 310, 320 and the holding capacitor 360. The pixel electrode 226 is provided on the planarization film 222. The pixel electrode 226 is provided for each pixel 103. The pixel electrode 226 is connected to the conductive layer 219-1 via the contact holes 221-1 provided in the planarization film 222. In other words, the transistor 310 is connected to the pixel electrode 226 via the conductive layers 218-3 and 219-1.

The light-emitting element 230 has the pixel electrode 226, an organic layer 232, and a common electrode 234. In an embodiment of the present invention, the display device 100 may be a top emission type or a bottom emission type. In this embodiment, the display device 100 is described in the case of a top emission structure. In the top emission structure, the pixel electrode 226 serves as the anode and the common electrode 234 serves as the cathode.

An insulating film 228 is arranged to cover an edge of the pixel electrode 226. The insulating film 228 is also referred to as partition or bank. The insulating film 228 may be opened to expose the pixel electrodes 226, and edges of the opening may be gently tapered. If the edges of the openings are tapered, poor coverage of the organic layer 232 formed later will result.

A plurality of organic materials constituting the organic layer 232 are stacked on the pixel electrode 226 and the insulating film 228. The organic layer 232 is provided by stacking a hole transport layer, an emission layer, and an electron transport layer, etc., in order from the pixel electrode 226 side. These layers may be formed by vapor deposition or by a coating formation using a solvent dispersion. The hole transport layer and the electron transport layer, etc. may be formed selectively for each sub-pixel, or may be formed over the entire surface of the display area 102.

The common electrode 234 is arranged on the organic layer 232. In this embodiment, the common electrode 234 must be transparent due to the top emission structure. When MgAg is used as the common electrode 234, it is formed as a thin film to the extent that the light emitted from the organic layer 232 is transmitted. The common electrode 234 is connected to the wiring layer at the cathode contact portion in the peripheral area 109 and is electrically connected to the terminal 106.

An encapsulating film 240 is arranged on the common electrode 234. The encapsulating film 240 is provided to prevent moisture from entering the organic layer 232 from the outside. In this embodiment, an example of a three-layer structure of an inorganic insulating film 236, an organic insulating film 238, and an inorganic insulating film 242 is shown as the encapsulating film 240. It is preferred to use silicon nitride having high gas barrier properties as the inorganic insulating films 236 and 233, and an organic resin material having high flexibility as the organic insulating film 238. A silicon oxide film or amorphous silicon film may be provided between the silicon nitride and the organic resin material. This may improve the adhesion between the silicon nitride and the organic resin material. An overcoat layer may be arranged on the inorganic insulating film 242, for example, for planarization.

A touch sensor 110 is arranged on the encapsulating film 240. The touch sensor 110 may be formed directly on the encapsulating film 240. Alternatively, a cover glass formed with the touch sensor 110 may be arranged on the encapsulating film 240.

<Material of Each Component of the Display Device 100>

A rigid substrate that is transparent and not flexible, such as glass, quartz, and sapphire substrates, can be used as the substrate 101. On the other hand, when the substrate 101 is required to be flexible, a flexible substrate that contains resin and has flexibility, such as a polyimide substrate, an acrylic substrate, a siloxane substrate, or a fluoroplastic substrate, can be used as the substrate 101. Impurities can be introduced into the above resin to improve the heat resistance of the substrate 101.

Common metallic materials can be used as the conductive layers 214-1 to 214-4 and 218-1 to 218-6. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), copper (Cu), and their alloys or compounds of these materials are used. The above materials may be used in a single layer or in a stack as the above components.

The insulating films 202, 212, 216, and 223 can be made from any of the common insulating film materials. For example, inorganic insulating films such as silicon oxide (SiOx), silicon oxide nitride (SiOxNy), silicon nitride (SiNx), silicon nitride oxide (SiNxOy), aluminum oxide (AlOx), aluminum oxide nitride (AlOxNy), aluminum nitride oxide (AlNxOy), aluminum nitride (AlNx), and other inorganic insulating films can be used. As these insulating films, insulating films with few defects can be used. Organic insulating materials such as polyimide resin, acrylic resin, epoxy resin, silicone resin, fluorine resin, or siloxane resin are used as the planarization film 222 and the insulating film 228. The above organic insulating materials may be used as the insulating films 202, 212, 216, and 223. The above materials may be used as the above components in a single layer or in a laminate.

The above SiOxNy and AlOxNy are silicon and aluminum compounds containing a smaller proportion (x>y) of nitrogen (N) than oxygen (O). SiNxOy and AlNxOy are silicon and aluminum compounds containing a smaller proportion (x>y) of oxygen than nitrogen.

A metal oxide having semiconductor properties can be used as the oxide semiconductor layers 208-1 to 208-4. The oxide semiconductor layers 208-1 to 208-4 have transparent properties. For example, oxide semiconductors containing indium (In), gallium (Ga), zinc (Zn), and oxygen (O) can be used. In particular, an oxide semiconductor having a composition ratio of In:Ga:Zn:O=1:1:1:4 can be used. However, the oxide semiconductor containing In, Ga, Zn, and O used in this embodiment is not limited to the above composition, and an oxide semiconductor having a composition different from the above can also be used. For example, the ratio of In may be larger than the above to improve mobility. The ratio of Ga may be larger than the above to increase the band gap and reduce the effect of light irradiation.

Other elements may be added to the oxide semiconductor containing In, Ga, Zn and O. For example, metallic elements such as Al and Sn may be added to the oxide semiconductors. In addition to the above oxide semiconductors, oxide semiconductors containing In and Ga (IGO), oxide semiconductors containing In and Zn (IZO), oxide semiconductors containing In, Sn and Zn (ITZO), and oxide semiconductors containing In and W, etc., may be used as oxide semiconductor layers 208-1 to 208-4. When IGO or IZO is used as the oxide semiconductor, metallic elements such as Al or Sn may also be added. The oxide semiconductor layers 208-1 to 208-4 may be amorphous or crystalline. The oxide semiconductor layers 208-1 to 208-4 may be a mixture of amorphous and crystalline phases.

A transparent conductive layer is used as the pixel electrode 226 and the common electrode 234. A mixture of indium oxide and tin oxide (ITO) and a mixture of indium oxide and zinc oxide (IZO) may be used as the transparent conductive layer. Materials other than the above may be used as said transparent conductive layer.

Second Embodiment

In this embodiment, another example of the pixels 103 included in the display device 100 is described with reference to FIG. 5 and FIG. 6. In this embodiment, the parts that differ from the first embodiment are described, and detailed descriptions of the other parts are omitted.
<Equivalent Circuit Diagram>

Figure 5:
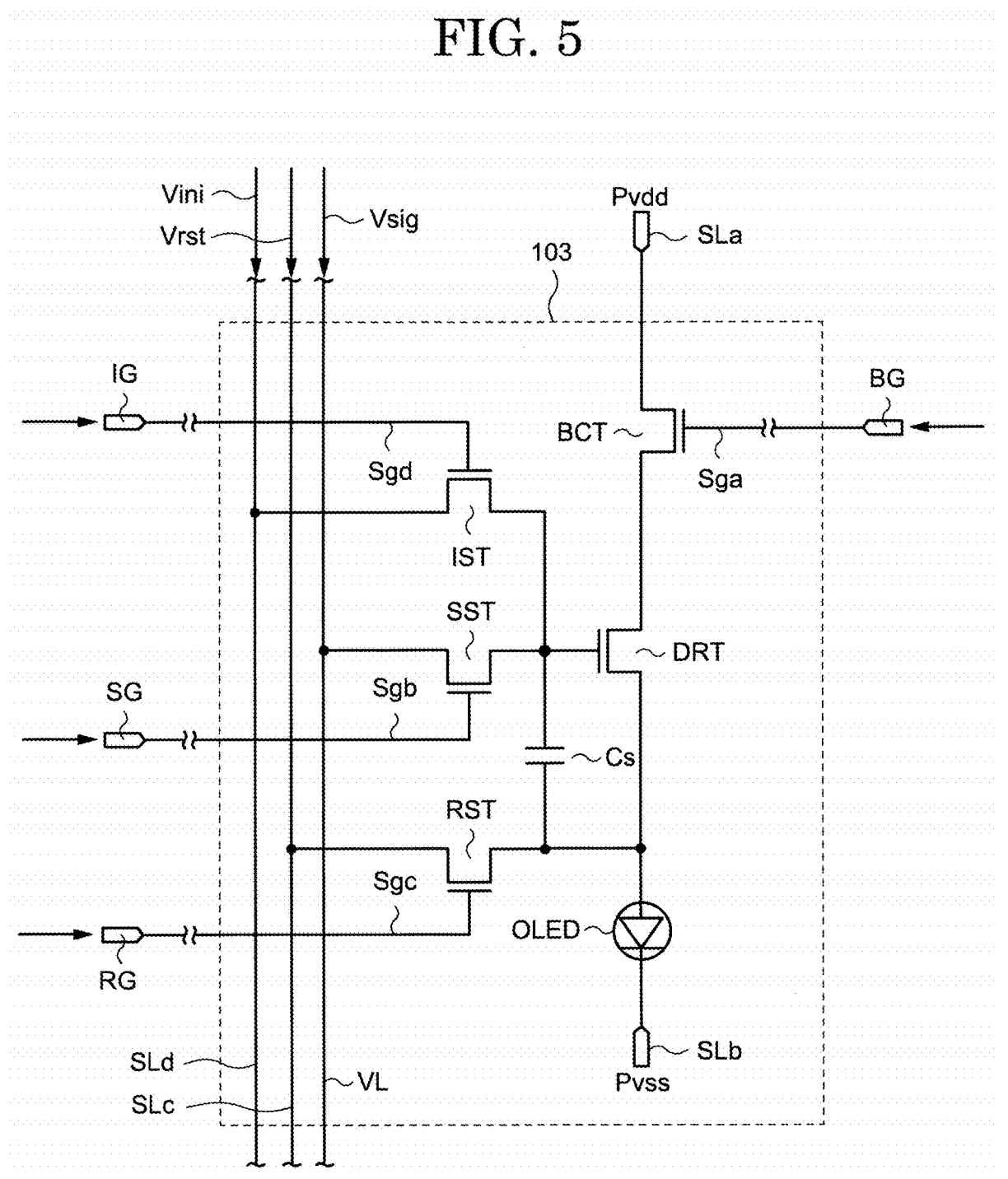

FIG. 5 shows the equivalent circuit diagram of the pixel circuit of a pixel 103A. In this embodiment, an example is described in which a transistor IST (also called a fifth transistor) is added to the pixel circuit shown in FIG. 2 is described. For the composition of the writing transistor SST, the driving transistor DRT, the output transistor BCT, and the reset transistor RST and the like, refer to the description of the first embodiment.

The pixel 103A includes at least the writing transistor SST, the driving transistor DRT, the output transistor BCT, the reset transistor RST, the initializing transistor IST, the holding capacitor Cs, and the light-emitting element OLED. The initializing transistor IST has a first terminal, a second terminal, and a control terminal.

In the initializing transistor IST, the source electrode is connected to an initialization signal line SLd, the drain electrode is connected to the gate electrode of the driving transistor DRT, the drain electrode of the writing transistor SST, and one of the holding capacitors Cs, and the gate electrode is connected to an initialization scanning line Sgd. In the initializing transistor IST, the ON or OFF state is controlled by a control signal IG from the initialization scanning line Sgd. When the initializing transistor IST is in the ON state, the gate electrode of the driving transistor DRT is fixed to an initialization potential Vini through the initializing transistor IST.

Figure 6:
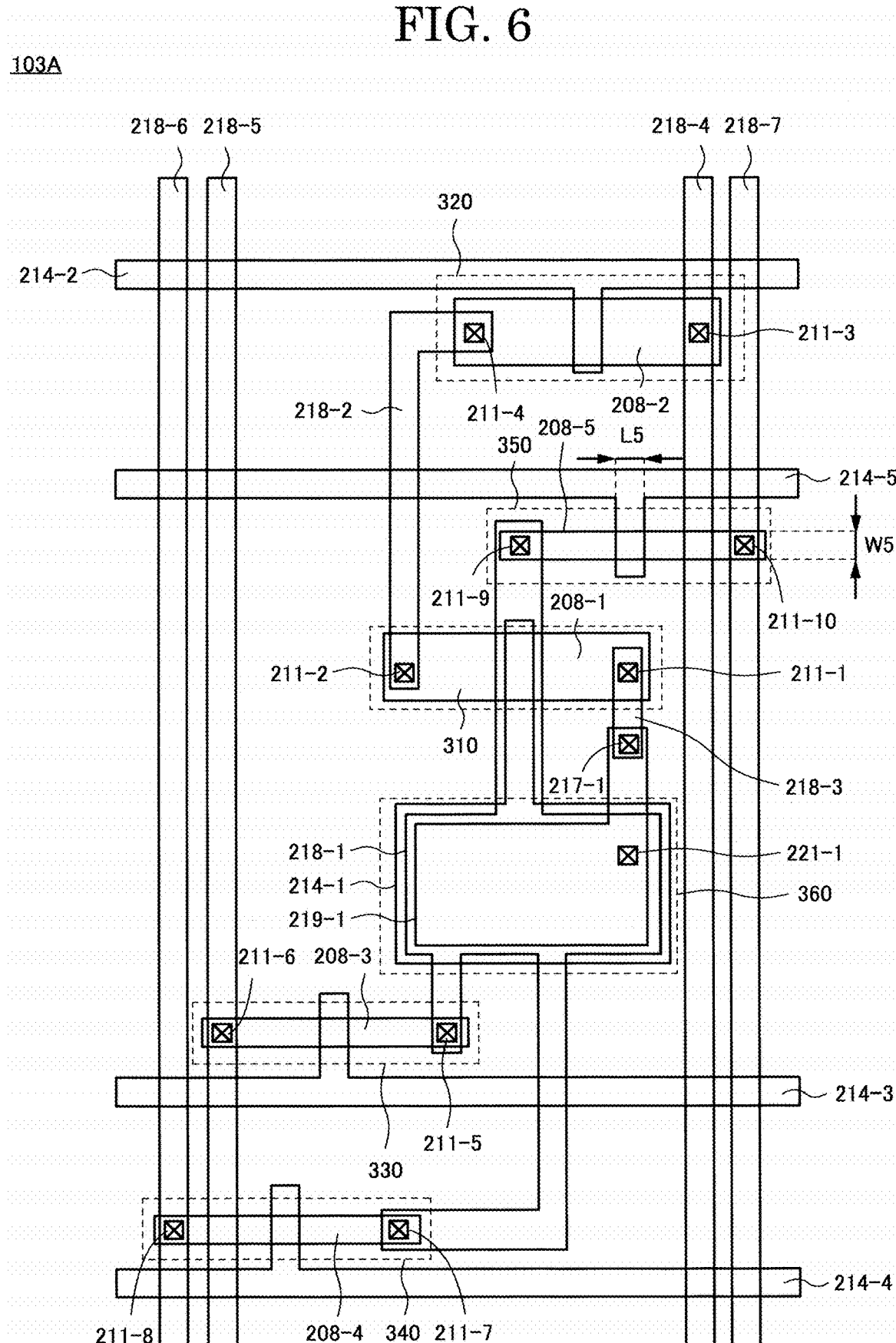
FIG. 6 a planar layout diagram of a pixel of a display device according to an embodiment of the present invention.

FIG. 6 shows the planar layout of pixel 103A of the display device 100 in an embodiment of the invention.

As shown in FIG. 6, the pixel 103A has the transistors 310, 320, 330, 340, and a transistor 350, and the holding capacitor 360. Compared to the layout diagram shown in FIG. 3, the layout diagram shown in FIG. 5 has an additional transistor 350. The transistor 350 corresponds to the initializing transistor IST. The transistor 350 will be described as a top gate driving transistor, but it may be a bottom gate driving transistor or a dual gate driving transistor. In this embodiment, the transistors 310, 320, 330, 340, and 350 will be described as top gate driving transistors.

In FIG. 6, the oxide semiconductor layers 208-1 to 208-5, the conductive layers 214-1 to 214-5, the conductive layers 218-1 to 218-7, and the contact holes 211-1 to 211-10, 217-1, and 221-1 are illustrated. Compared to the layout diagram shown in FIG. 3, the oxide semiconductor layer 208-5, the conductive layer 214-5, and the conductive layer 218-7 are additionally arranged.

The transistor 350 includes the oxide semiconductor layer 208-5, the conductive layer 214-5, the conductive layers 218-1, 218-7, and the gate insulating film. The conductive layer 214-5 functions as a gate electrode in a region overlapping the oxide semiconductor layer 208-5. The oxide semiconductor layer 208-5 is connected to the conductive layers 218-1 and 218-7 via the contact holes 211-9 and 211-10 in the gate insulating film and the interlayer insulating film, respectively.

The transistor 350 has a channel width of W5 and a channel length of L5. Comparing the transistor 310 and the transistor 350, the W1/L1 ratio of the transistor 310 is larger than the W5/L5 ratio of the transistor 350. For example, the W1/L1 ratio of the transistor 310 is 1.5 or more, while the W5/L5 ratio of the transistor 350 is less than 1.5.

Since the transistor 350 is the initializing transistor IST, it is dominantly negatively biased. In addition, the transistor 350 is not a transistor directly connected to the light-emitting element OLED. Therefore, the W5/L5 ratio of the transistor 350 may be less than 1.5.

The W5/L5 ratio of the transistor 350 may be the same as or different from the W3/L3 ratio of the transistor 330 and the W4/L4 ratio of the transistor 340.

In this embodiment, the illustration shows a case in which the channel length L1 of the transistor 310 and the channel length L2 of the transistor 320, and the channel length L3 of the transistor 330, the channel length L4 of the transistor 340, and the channel length L5 of the transistor 350 are the same length, but this embodiment of the invention is not limited. The channel length L1 of the transistor 310 may be different from the channel length L3 of the transistor 330, the channel length L4 of the transistor 340, and the channel length L5 of the transistor 350. Specifically, the channel length L1 of the transistor 310 may be longer than the channel length L3 of the transistor 330, the channel length L4 of the transistor 340, and the channel length L5 of the transistor 350. By increasing the channel length L1 of the transistor 310, the S value can be increased.

EXAMPLES

This example describes the Id-Vg characteristics of a display device having a display area consisting of the pixels shown in FIG. 5 after driving at 70° C. for 500 hours.

In this example, a display device was manufactured with a display area consisting of the pixels shown in FIG. 5. The display device was then driven at 70° C. for 500 hours. The driving transistor DRT, the output transistor BCT, the writing transistor SST, the reset transistor RST, and the initializing transistor IST are all top-gate transistors. The size of the transistors of the driving transistor DRT, the output transistor BCT, the writing transistor SST, the reset transistor RST, and the initializing transistor IST are as follows: channel length L=3 μm and channel width W=3 μm. The W/L ratio of each transistor is described as a W1/L1 ratio of the driving transistor DRT, a W2/L2 ratio of the output transistor BCT, a W3/L3 ratio of the writing transistor SST, a W4/L4 ratio of the reset transistor RST, and a W5/L5 ratio of the initializing transistor IST.

The Id-Vg characteristics of the transistor IST and the transistor BCT in the pixel 103 shown in FIG. 5 were measured before and after driving. The Id-Vg characteristics were measured as the gate voltage (Vg) applied to the gate electrode of each transistor. The gate voltage (Vg) applied to the gate electrode of each transistor was applied from −5V to +10V in 0.1V steps. The source voltage (Vs) applied to the source electrode was 0 V, and the drain voltage (Vd) applied to the drain electrode was 0.1 V and 10 V.

Figure 7:
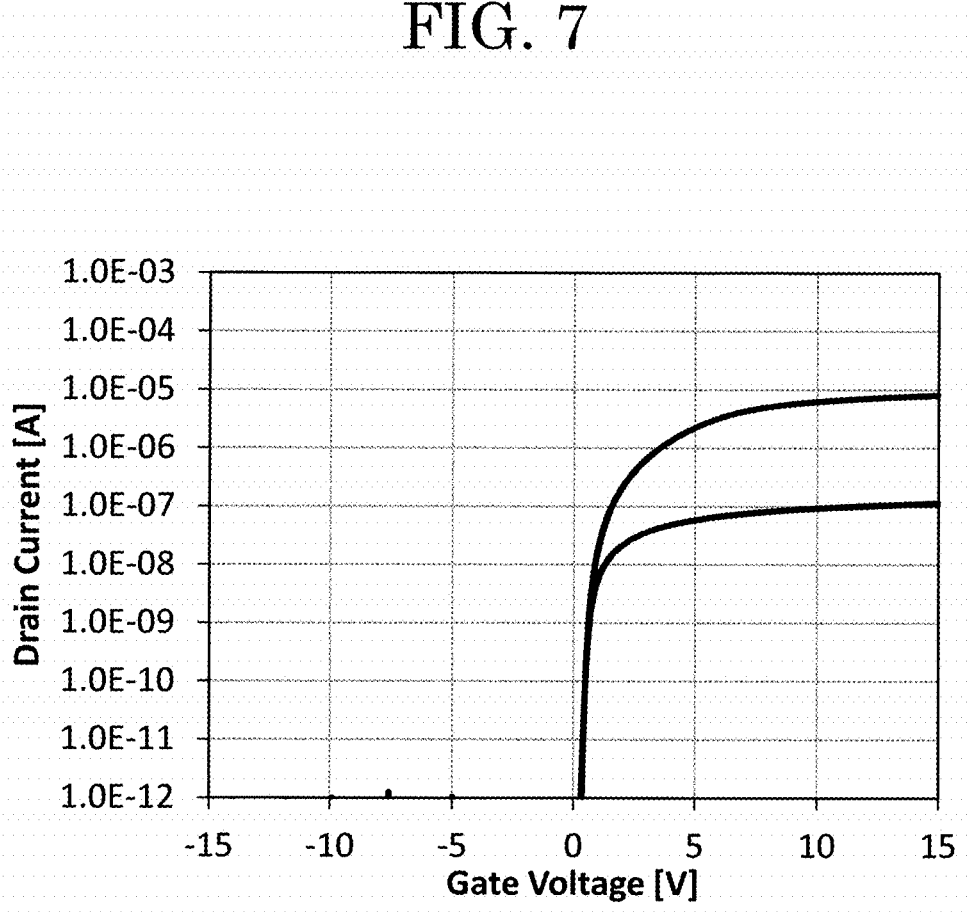
FIG. 7 is a graph showing Id-Vg characteristics of a transistor IST.
Figure 8:
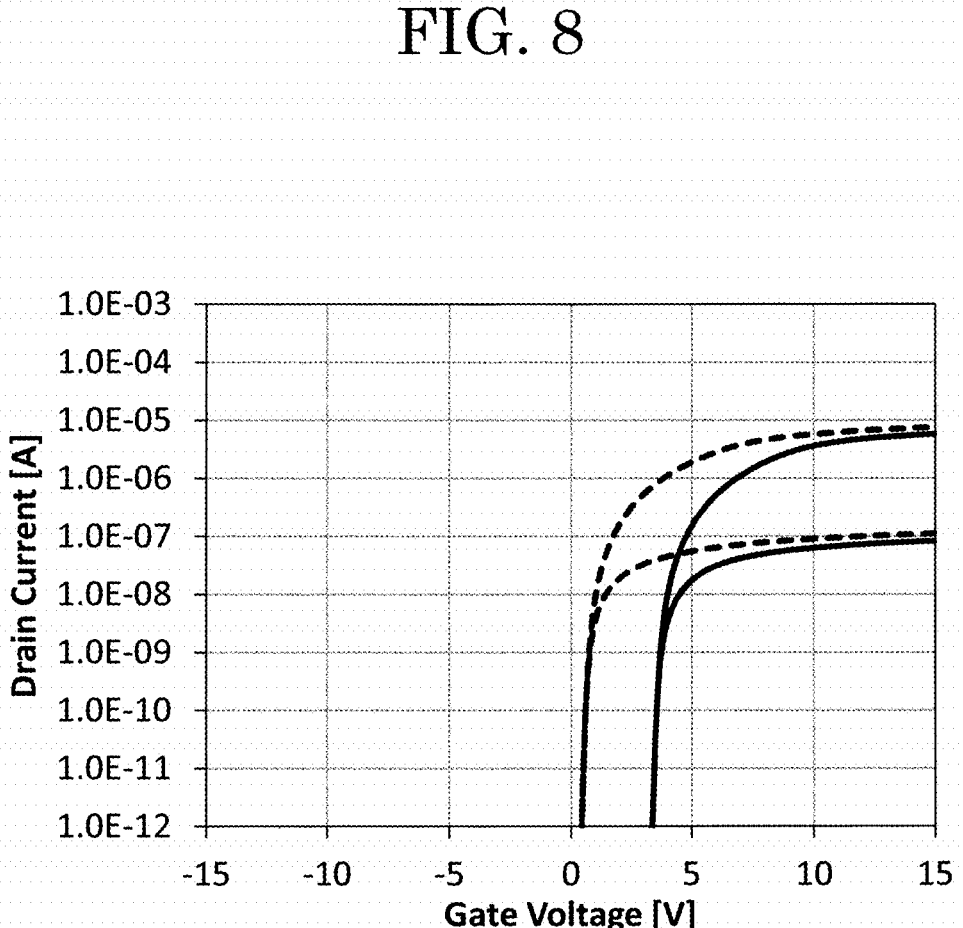
FIG. 8 is a graph showing Id-Vg characteristics of a transistor BCT.

FIG. 7 is a graph of the Id-Vg characteristic of the transistor IST. FIG. 8 is a graph of the Id-Vg characteristic of the transistor BCT. In FIG. 7 and FIG. 8, the vertical axis is the drain current Id [A] and the horizontal axis is the gate voltage Vg [V]. In FIG. 7 and FIG. 8, the dotted line is a graph of the Id-Vg characteristic in the initial state, and the solid line is a graph of the Id-Vg characteristic after driving.

As shown in FIG. 7, for the transistor IST, no change was observed in the Id-Vg characteristic between the initial state of the display device and after driving. On the other hand, as shown in FIG. 8, for the transistor BCT, a positive drift in the Id-Vg characteristic was observed between the initial state of the display device and after driving.

The results shown in FIG. 7 and FIG. 8 indicate that the Id-Vg characteristic drifts to the positive when a positive bias is applied to the transistor BCT connected in series with the light-emitting element OLED. In other words, when the W1/L1 ratio of the transistor BCT connected in series with the light-emitting element OLED is less than 1.5, the amount of degradation increases.

Next, the result of studying the W/L dependence of the variation of the threshold voltage Vth on the PBTS stress is described.

First, transistors with different W/L ratios between a channel length L and a channel width W were manufactured. The transistors TrA to TrL were manufactured with a channel length L of 2 μm, 3 μm, and 4 μm, respectively, and a channel width W of 3 μm, 4.5 μm, 6 μm, and 7.5 μm, respectively. The manufactured transistors TrA to TrL are listed in Table 1.

TABLE 1

|  | W = 3 μm | W = 4.5 μm | W = 6 μm | W = 7.5 μm |
|---|---|---|---|---|
| L = 2 μm | TrA | TrB | TrC | TrD |
| L = 3 μm | TrE | TrF | TrG | TrH |
| L = 4 μm | TrI | TrJ | TrK | TrL |

The W/L dependence of the threshold voltage variation Vth was performed using the PBTS (Positive Bias Temperature Stress) test. The PBTS test conditions were as follows: the gate voltage (Vg) was set to +30V, the drain voltage (Vd) and source voltage (Vs) were set to 0V (COMMON), the stress temperature was set to 60° C., the stress application time was 0 second and 3600 seconds, and the measurement environment was a dark environment. In other words, the source and drain electrodes of the transistor were set to the same potential, and a potential different from that of the source and drain electrodes was applied to the gate electrode for a certain time. The potential applied to the gate electrode was higher than the potentials of the source and drain electrodes.

The results of the PBTS test are shown in FIG. 9A to FIG. 9L. Each result in FIG. 9A to FIG. 9L corresponds to one transistor TrA to TrL. In FIG. FIG. 9A to FIG. 9L, the vertical axis is the drain current Id [A] and the horizontal axis is the gate voltage Vg [V]. Table 2 shows the W/L ratio, the threshold voltage Vth [V], and the threshold voltage variation ΔVth [V] for the transistors TrA to TrL. In FIG. 9A to FIG. 9L, the Id-Vg characteristics at 0.1 V and 10 V for the drain voltage (Vd) when the voltage application time is 0 second are shown as dashed lines, and the Id-Vg characteristics at 0.1V and 10V when the voltage application time is 3600 seconds are shown as solid lines.

TABLE 2

| Transistor | W/L ratio | Vth[V] | ΔVth[V] |
|---|---|---|---|
| TrA | 1.50 | 0.54 | 1.89 |
| TrB | 2.00 | 0.38 | 1.33 |
| TrC | 3.00 | 0.24 | 0.97 |
| TrD | 3.75 | 0.05 | 0.47 |
| TrE | 1.00 | 0.84 | 2.15 |
| TrF | 1.50 | 0.59 | 1.76 |
| TrG | 2.00 | 0.44 | 1.21 |
| TrH | 2.50 | 0.39 | 0.93 |
| TrI | 0.75 | 0.90 | 2.55 |
| TrJ | 1.13 | 0.76 | 2.25 |
| TrK | 1.50 | 0.67 | 1.62 |
| TrL | 1.88 | 0.46 | 1.04 |

Figure 9A:
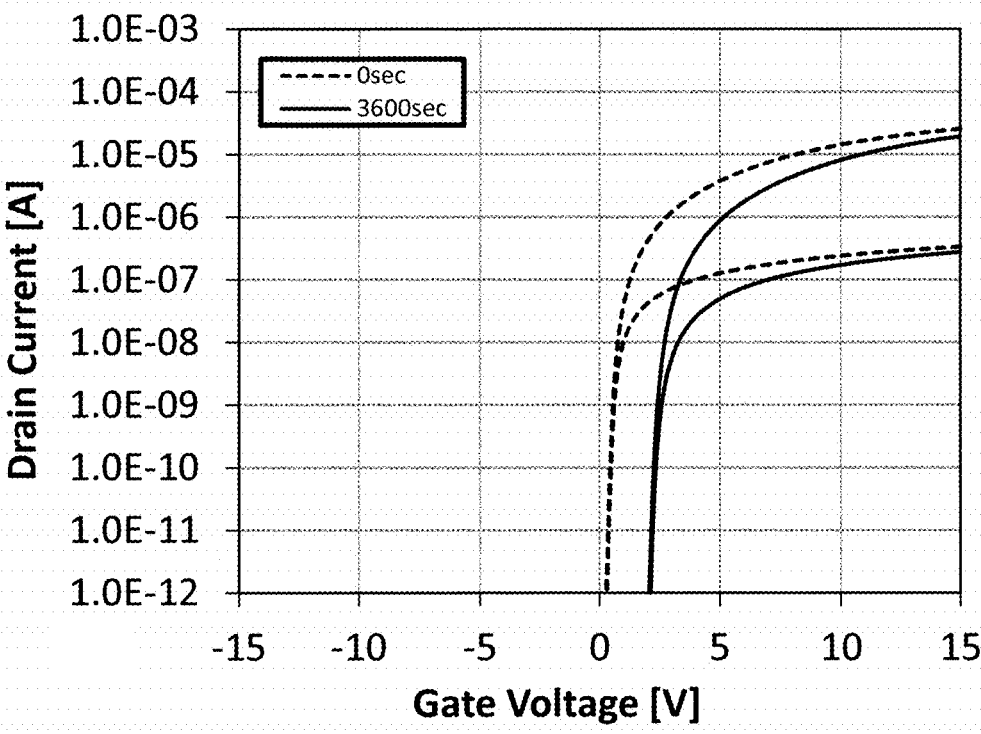
FIG. 9A is a graph showing the results of the PBTS test.
Figure 9B:
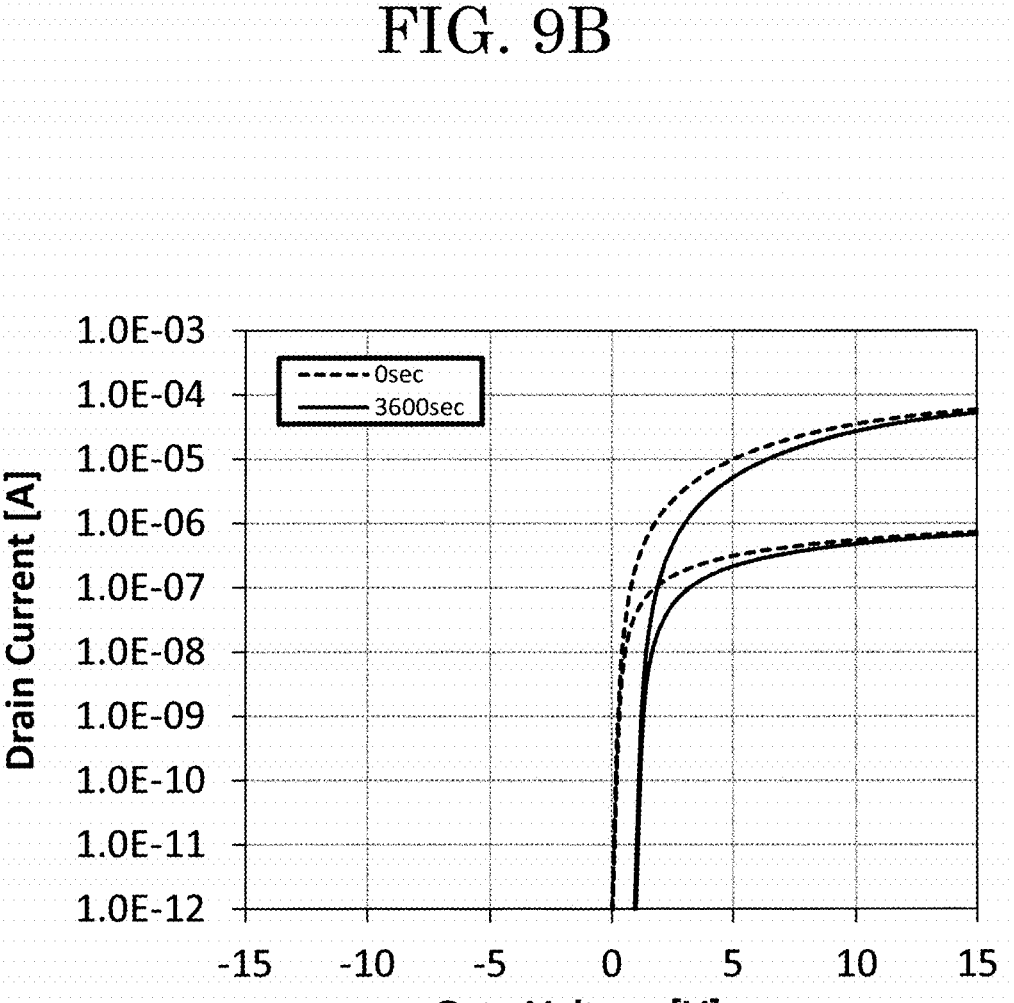
FIG. 9B is a graph showing the results of the PBTS test.
Figure 9C:
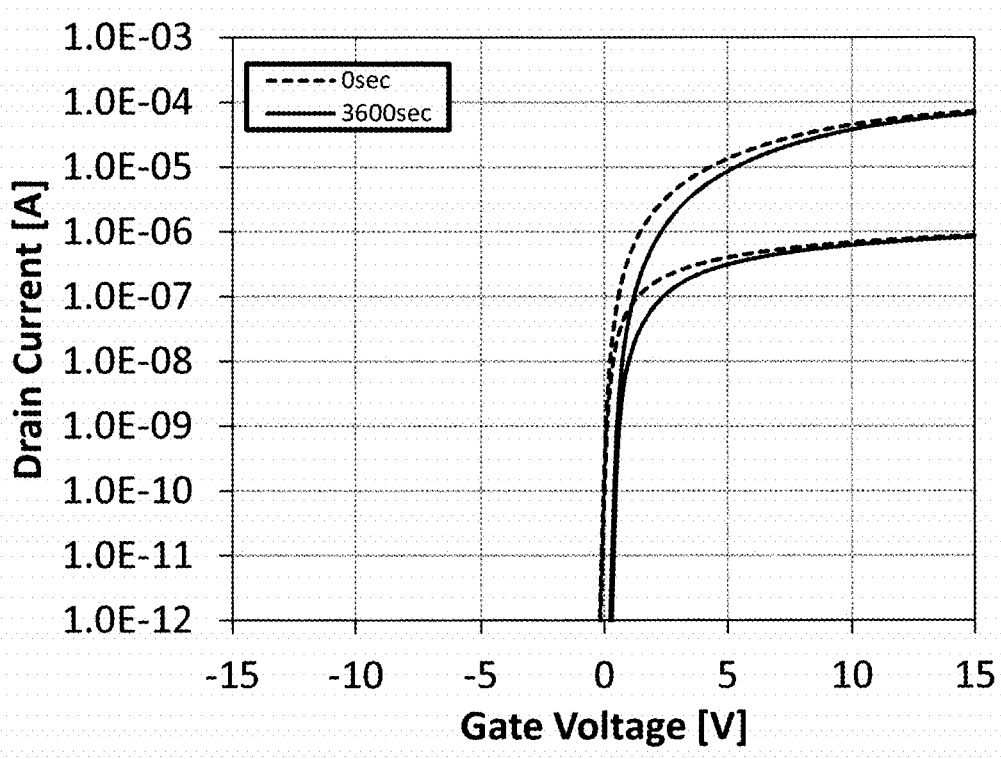
FIG. 9C is a graph showing the results of the PBTS test.
Figure 9D:
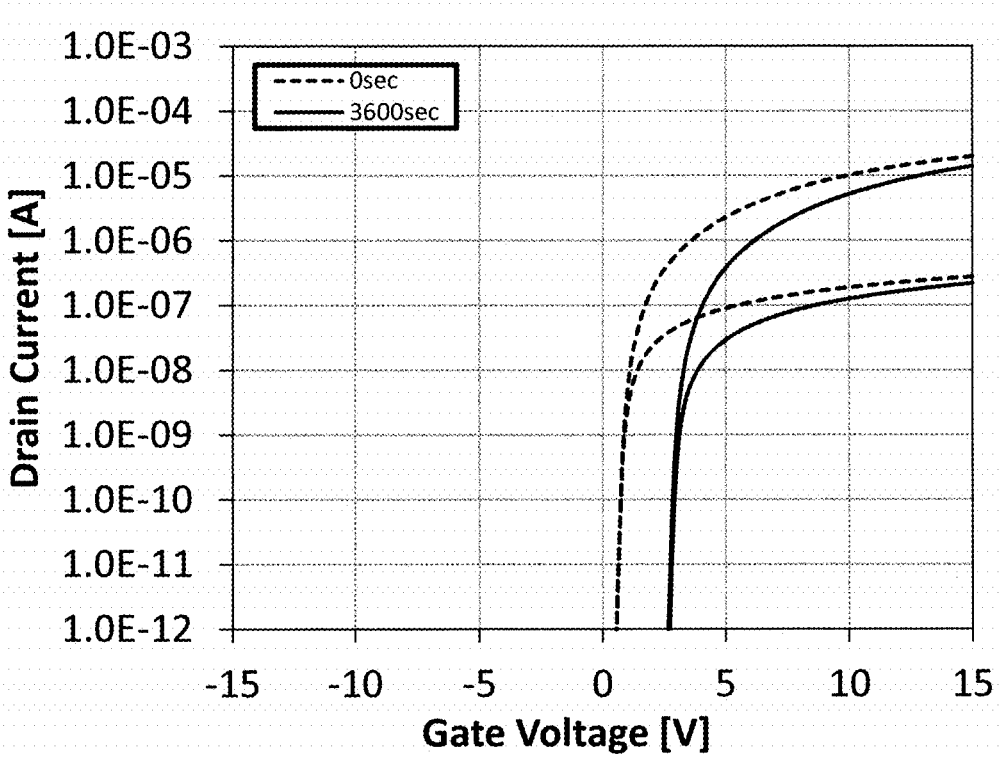
FIG. 9D is a graph showing the results of the PBTS test.
Figure 9E:
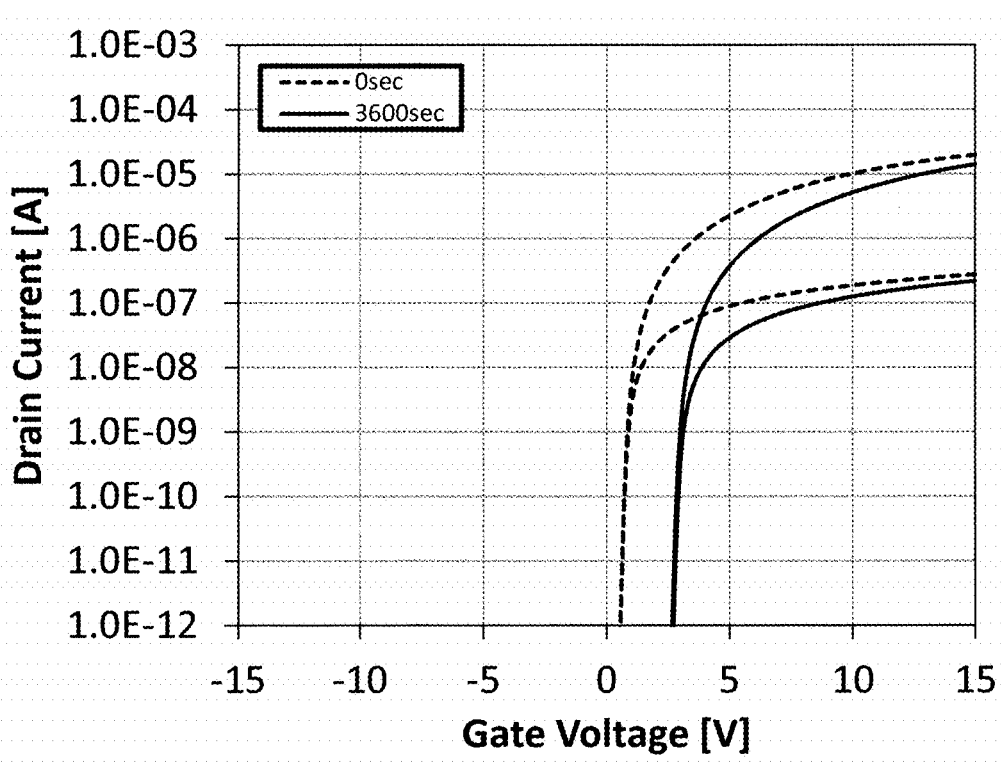
FIG. 9E is a graph showing the results of the PBTS test.
Figure 9F:
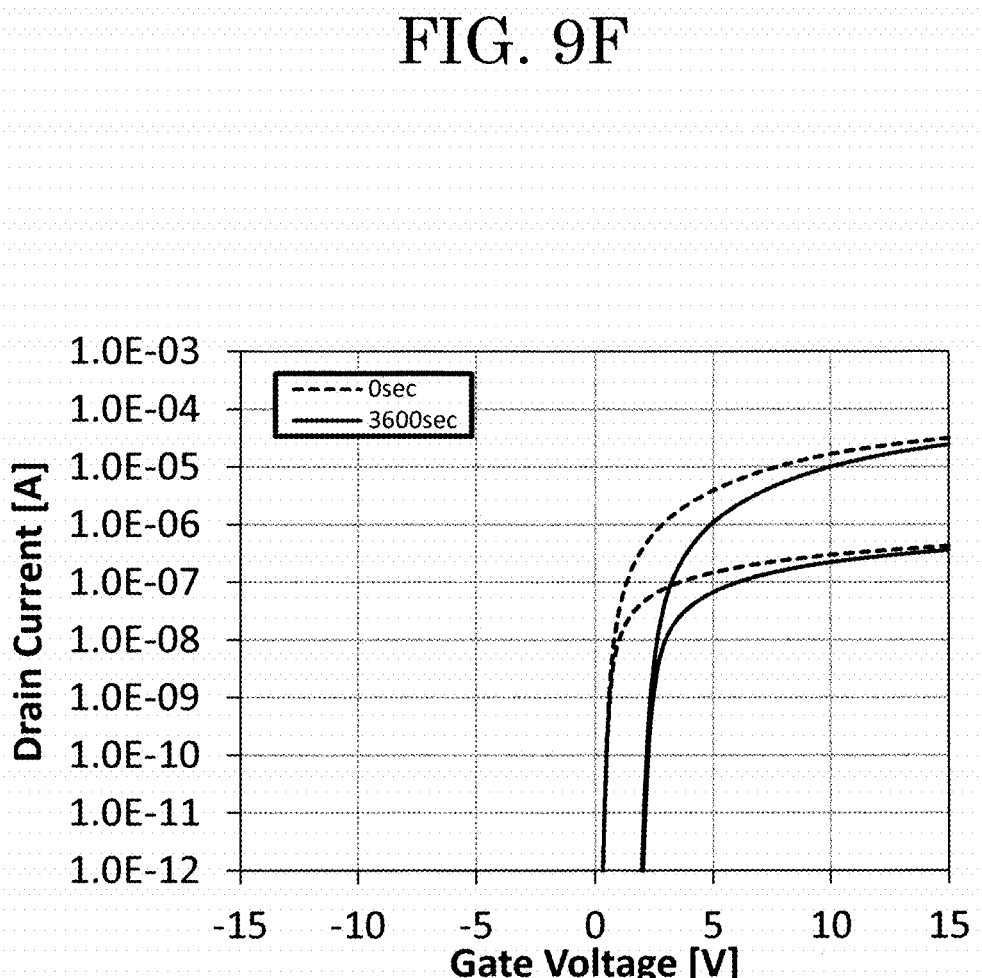
FIG. 9F is a graph showing the results of the PBTS test.
Figure 9G:
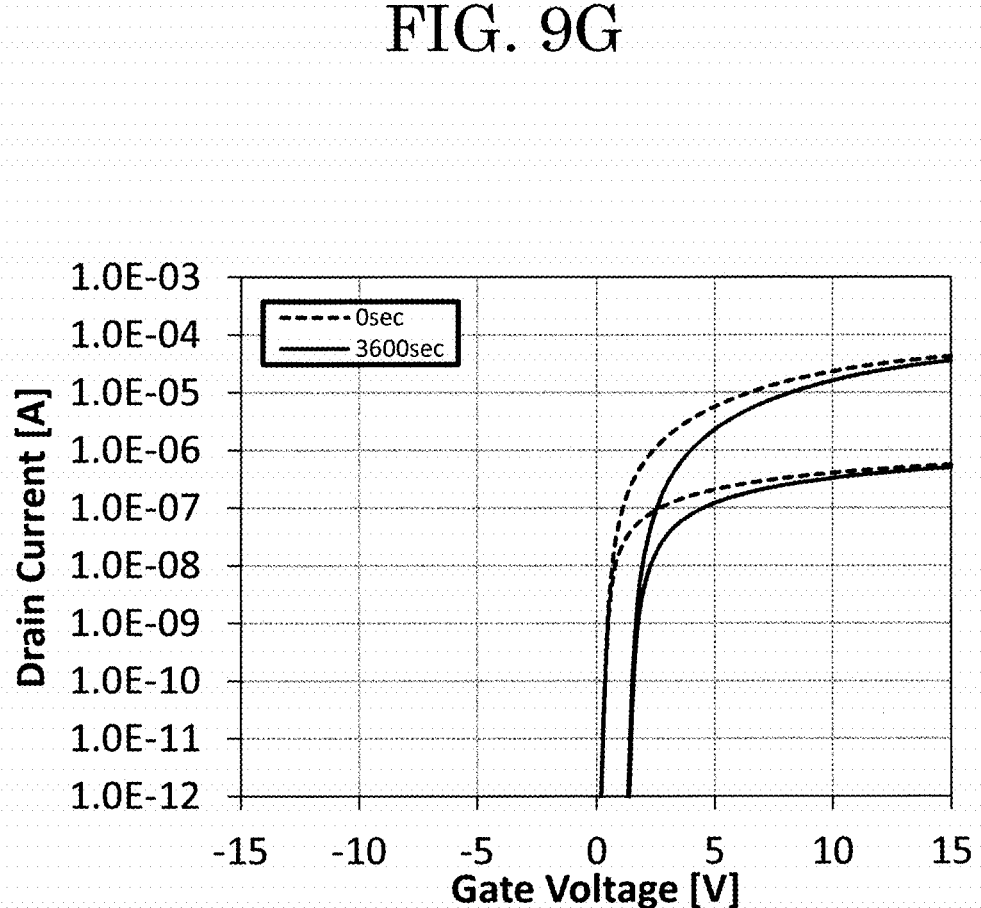
FIG. 9G is a graph showing the results of the PBTS test.
Figure 9H:
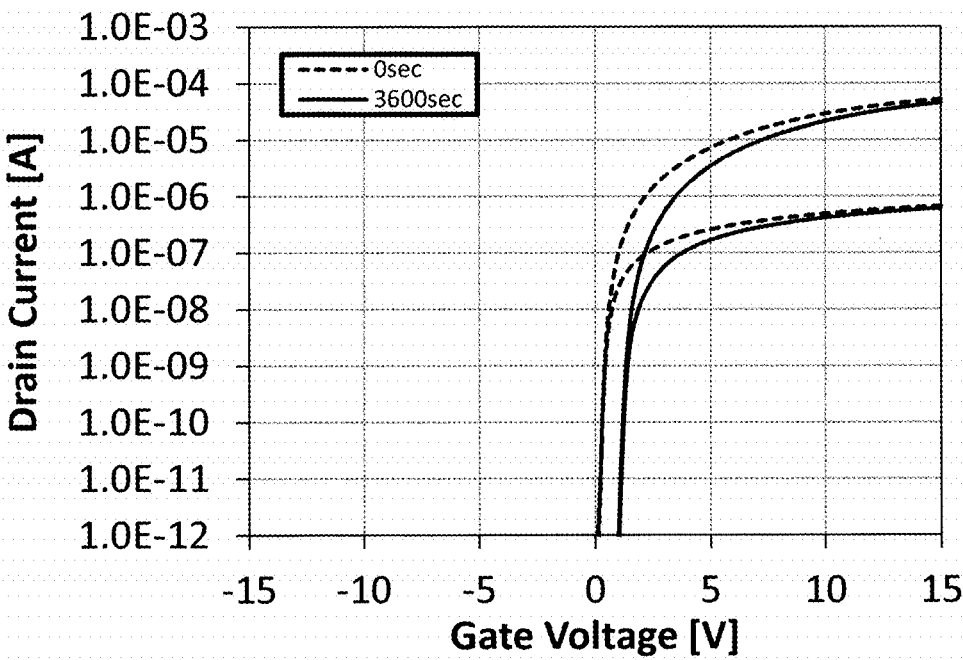
FIG. 9H is a graph showing the results of the PBTS test.
Figure 9I:
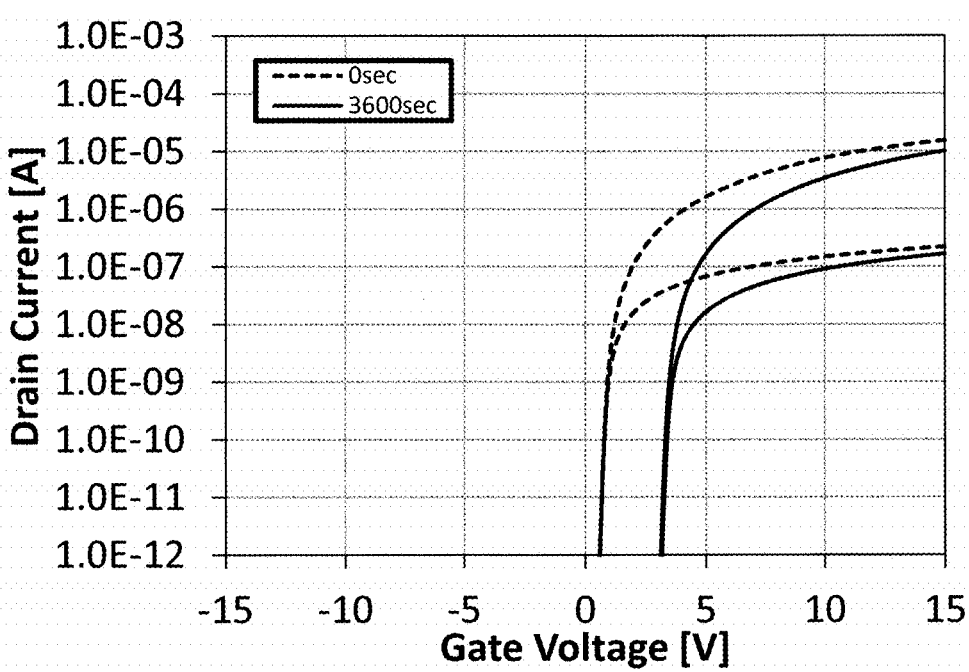
FIG. 9I is a graph showing the results of the PBTS test.
Figure 9J:
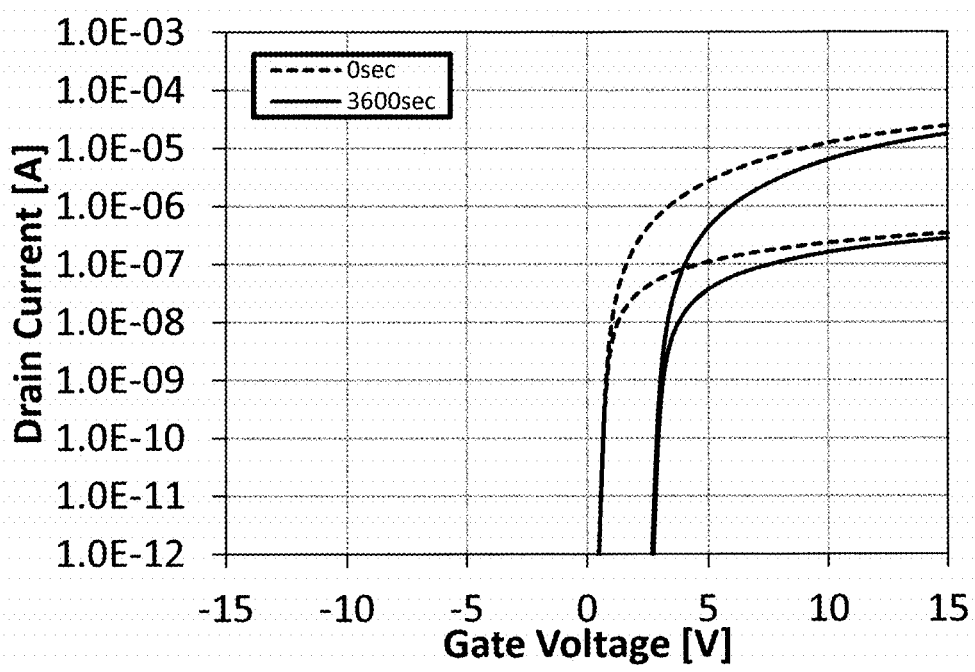
FIG. 9J is a graph showing the results of the PBTS test.
Figure 9K:
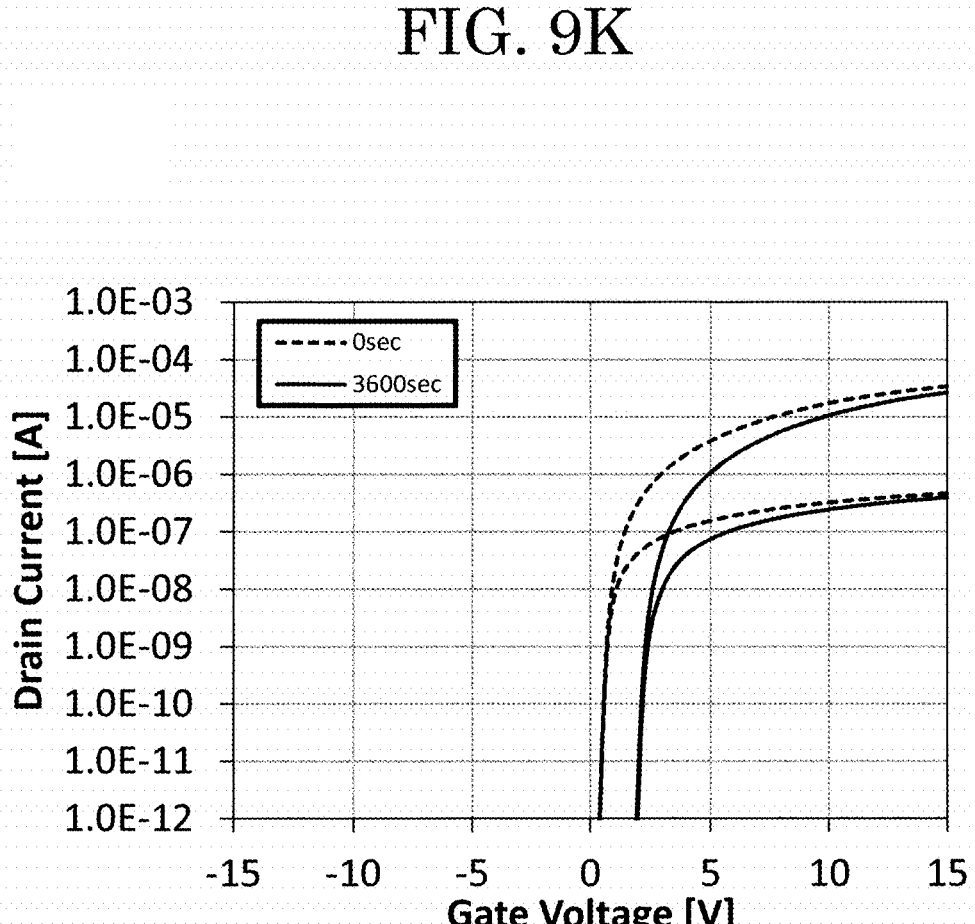
FIG. 9K is a graph showing the results of the PBTS test.
Figure 9L:
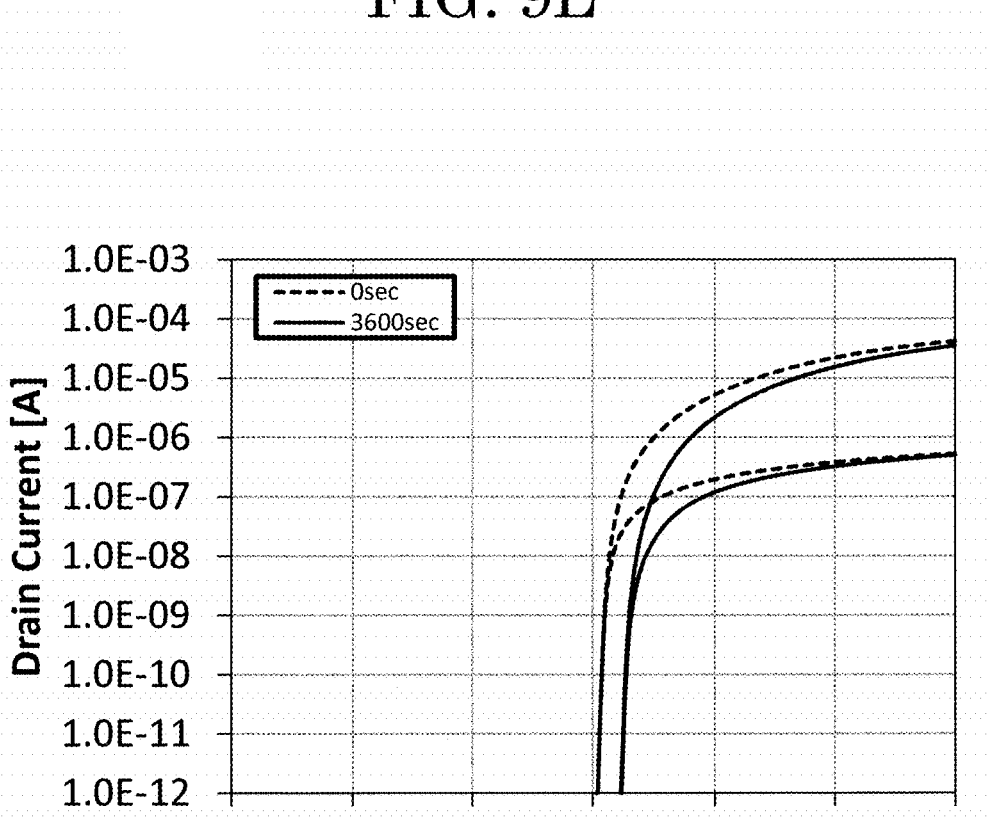
FIG. 9L is a graph showing the results of the PBTS test.

As shown in Table 2, FIG. 9E, FIG. 9I, and FIG. 9J, when the W/L ratio is less than 1.5 for the size of the transistor, the threshold voltage Vth of the transistor is shifted to positive by 2.0 V or more. On the other hand, as shown in Table 2, FIG. 9A to FIG. 9D, FIG. 9F to FIG. 9H, FIG. 9K, and FIG. 9L, when the W/L ratio is 1.5 or more for the size of the transistor, the threshold voltage Vth of the transistor is shifted to positive but less than 2.0V.

As explained above, it has been shown that a W/L ratio of 1.5 or more for the transistor size can suppress the positive shift of the threshold voltage. Therefore, it is suggested that using transistors with a W/L ratio of 1.5 or more as the transistors DRT and BCT to which a positive bias is continuously applied in the display device improves the reliability of the display device.

Next, four display devices according to an embodiment of the present invention were manufactured and driven at 70° C. for 500 hours, and then the result of examining the amount of change in the threshold voltage of the transistor will be described.

The manufactured display device has the pixel circuit shown in FIG. 3 in the display area. The channel width W of the driving transistor DRT and the output transistor BCT of the display device A is 3 μm and the channel length L is 3 μm. The channel width W of the writing transistor SST and the reset transistor RST is 3 μm, and the channel length L is 3 μm.

The channel width W of the driving transistor DRT and the output transistor BCT of the display device B is 4.5 μm and the channel length L is 3 μm. The channel width W of the writing transistor SST and the reset transistor RST is 3 μm, and the channel length L is 3 μm.

The channel width W of the driving transistor DRT and the output transistor BCT of the display device C is 6 μm and the channel length L is 3 μm. The channel width W of the writing transistor SST and the reset transistor RST is 3 μm, and the channel length L is 3 μm.

Figure 10:
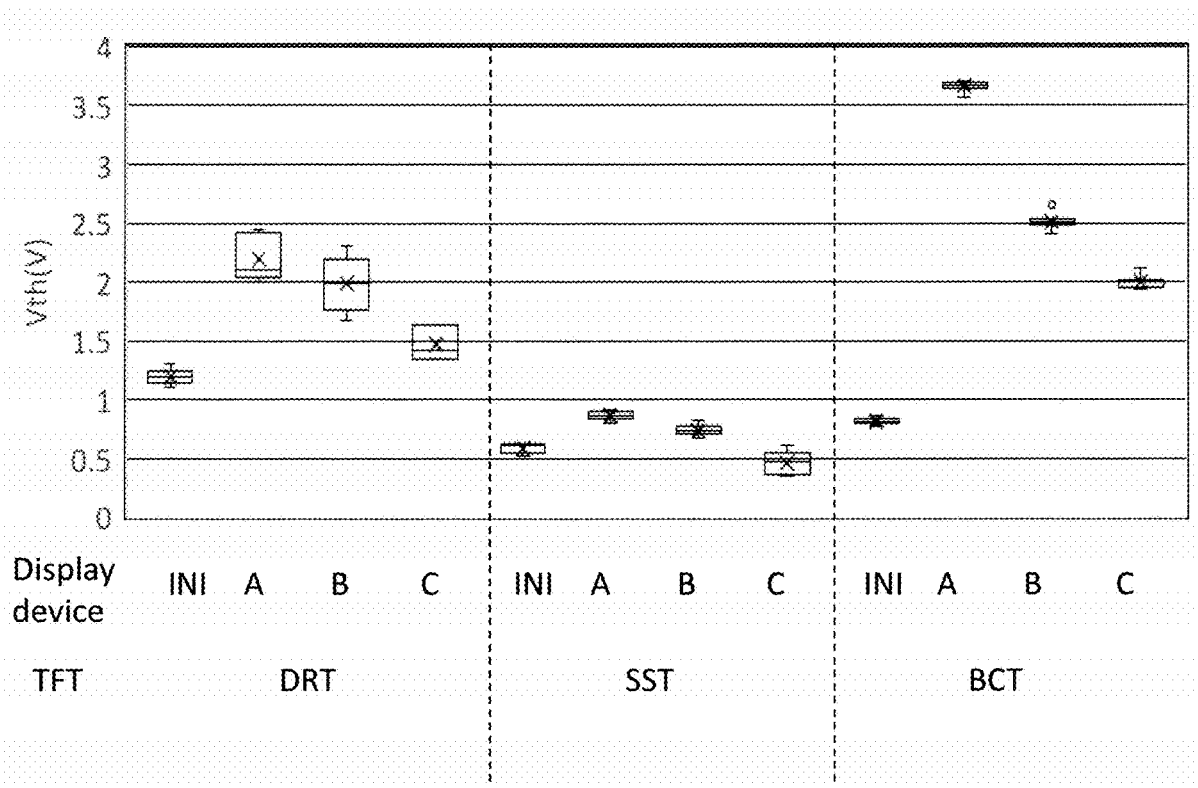
FIG. 10 shows the relationship between a driving transistor DRT, a writing transistor SST, and an output transistor BCT, and the threshold voltage Vth [V], for display devices A to C and a display INI, respectively.

For the manufactured display devices A to C, driving voltages were applied, a gray test signal was applied, and the panels were turned on continuously for 500 hours in an environment of 70° C. The Id-Vg characteristics after driving were then measured for the driving transistor DRT, the writing transistor SST, and the output transistor BCT of each of the display devices A to C. FIG. 10 shows the relationship between the threshold voltage Vth [V] and the transistors included in each of the display devices A to C and the display device INI. The transistors are the driving transistor DRT, the writing transistor SST, and the output transistor BCT. The horizontal axis is the driving transistor DRT, the writing transistor SST, and the output transistor BCT in each of the display devices A to C and the display device INI, and the vertical axis is the threshold voltage Vth [V]. The display device INI is a display device formed under the same conditions as the display device A, and is equivalent to the state of the display device A before 500 hours of continuous illumination.

Next, the display devices A-C were disassembled and the Id-Vd characteristics of the transistors were measured to determine the threshold voltage.

In the display device A, where the W/L ratios of the transistors are all 1, a tendency for the threshold voltages of the driving transistor DRT and the output transistor BCT to drift to the positive side was observed. In the display devices B and C, in which the W/L ratios of the driving transistor DRT and the output transistor BCT are 1.5 or more, it is suggested that the threshold voltages of the driving transistor DRT and the output transistor BCT are suppressed from drifting to the positive side than the threshold voltages of the driving transistor DRT and the output transistor BCT of the display device A.

Figure 11:
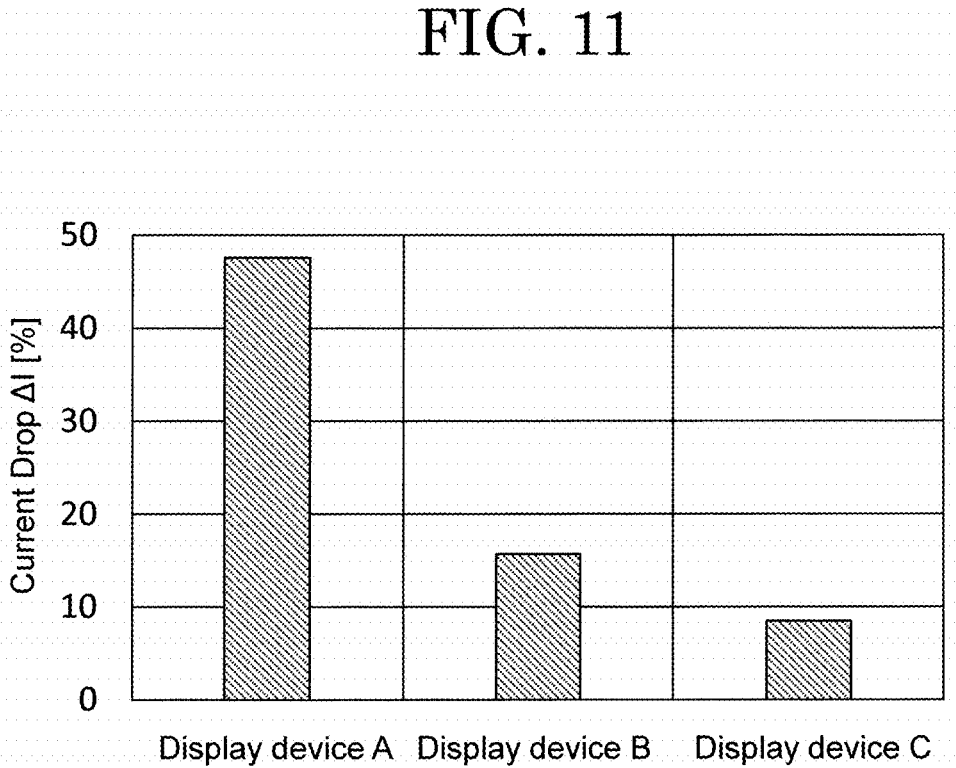
FIG. 11 summarizes the amount of current drop after driving display devices A to C.

FIG. 11 is a graph summarizing the amount of current drop after driving the display devices A to C. The horizontal axis is the display devices A to C, and the vertical axis is the amount of current drop [%]. As shown in FIG. 11, in the case of the display device A, where the W/L ratio of the output transistor BCT and the driving transistor DRT connected in series between the light-emitting element OLED and the drive power line is 1, the amount of current drop is 46%. In contrast, in the case of the display device B, where the W/L ratio of the output transistor BCT and the driving transistor DRT is 1.5 or more, the amount of current drop was found to be 15.7%. In the case of display device C, where the W/L ratio of the output transistor BCT and the driving transistor DRT is 2.0 or more, the amount of current drop was found to be 8.5%. As shown in FIG. 11, it was found that display devices B and C can significantly reduce the amount of current drop compared to display device A.

Therefore, it has been shown that when the W/L ratio of the output transistor BCT and the driving transistor DRT connected in series between the light-emitting element OLED and the driving power line is 1.5 or more, it is possible to provide a display device that is less susceptible to degradation even when driven for a long time.

Based on the display device described as embodiments and examples of the invention, those to which components are added, deleted or redesigned, or procedures are added, omitted or conditions are changed as appropriate by those skilled in the art, are also included within the scope of the invention as long as they have the gist of the invention. In addition, any of the foregoing embodiments may be combined with one another to the extent that no technical inconsistency results.

In addition, other effects which are different from the effects produced by the embodiments described above, but which are obvious from the description herein or which can be readily predicted by those skilled in the art, are naturally considered to be produced by the present invention.

Within the scope of the present invention, various changes and modifications may be made by those skilled in the art, and such changes and modifications will be deemed to be within the scope of the invention. For example, any addition, deletion, or design change of components, or addition or omission of processes, or change of conditions, made by a person skilled in the art to any of the foregoing embodiments, as appropriate, is included within the scope of the invention, so long as it retains the gist of the invention.

What is claimed is:

1. A display device comprising:
   a light-emitting element;
   a first transistor and a second transistor connected in series between the light-emitting element and a driving power line;
   a third transistor electrically connected to a gate electrode of the first transistor;
   a fourth transistor connected in parallel between a drain electrode of the first transistor and the light-emitting element; and
   a holding capacitor connected between the gate electrode and the drain electrode of the first transistor,
   wherein a ratio of a channel width W1 to a channel length L1 of the first transistor (a W1/L1 ratio) and a ratio of a channel width W2 to a channel length L2 of the second transistor (a W2/L2 ratio) are larger than a ratio of a channel width W3 to a channel length L3 of the third transistor (a W3/L3 ratio) and a ratio of a channel width W4 to a channel length L4 of the fourth transistor (a W4/L4 ratio).

2. The display device according to claim 1, wherein the W1/L1 ratio of the first transistor and the W2/L2 ratio of the second transistor are 1.5 or more, and the W3/L3 ratio of the third transistor and the W4/L4 ratio of the fourth transistor are less than 1.5.

3. The display device according to claim 1, further comprising:
   a fifth transistor electrically connected to the gate electrode of the first transistor,
   wherein the W1/L1 ratio of the first transistor is larger than a ratio of a channel width W5 to a channel length L5 of the fifth transistor (a W5/L5 ratio).

4. The display device according to claim 3, wherein
the W1/L1 ratio of the first transistor and the W2/L2 ratio
of the second transistor are 1.5 or more, and
the W5/L5 ratio of the fifth transistor is less than 1.5.

5. The display device according to claim 2, wherein the
W3/L3 ratio of the third transistor is the same as the W4/L4
ratio of the fourth transistor.

6. The display device according to claim 1, wherein the
channel length L1 of the first transistor is different from the
channel length L3 of third transistor and the channel length
L4 of the fourth transistor.

7. A display device comprising:
a high potential power source;
a low potential power source;
a light-emitting element including an anode and a cath-
ode, the cathode being connected to the low potential
power source;
a first transistor including a source electrode, a drain
electrode and a gate electrode, the drain electrode of the
first transistor being connected to the anode of the
light-emitting element;
a second transistor including a source electrode, a drain
electrode and a gate electrode, the drain electrode of the
second transistor being connected to the source elec-
trode of the first transistor, and the source electrode of
the second transistor being connected to the high poten-
tial power source;
a third transistor including a source electrode, a drain
electrode and a gate electrode, the drain electrode of the
third transistor being connected to the gate electrode of
the first transistor; and
a fourth transistor including a source electrode, a drain
electrode and a gate electrode, the drain electrode of the
fourth transistor being connected to the drain electrode
of the first transistor and the anode of the light-emitting
element,
wherein
a ratio of a channel width W1 to a channel length L1 of
the first transistor (a W1/L1 ratio) and a ratio of a
channel width W2 to a channel length L2 of the second
transistor (a W2/L2 ratio) are larger than a ratio of a
channel width W3 to a channel length L3 of the third
transistor (a W3/L3 ratio) and a ratio of a channel width
W4 to a channel length L4 of the fourth transistor (a
W4/L4 ratio).

8. The display device according to claim 7, further com-
prising:
a holding capacitor connected between the gate electrode
of the first transistor and the drain electrode of the first
transistor.

9. The display device according to claim 8, wherein
the holding capacitor is connected between the drain
electrode of the third transistor and the drain electrode
of the fourth transistor.

10. The display device according to claim 9, further
comprising:
an emission control scanning line,
wherein
the gate electrode of the second transistor is connected to
the emission control scanning line, and
the second transistor controls an emission time of the
light-emitting element in response to a control signal
from the emission control scanning line.

11. The display device according to claim 10, further
comprising:
a write control scanning line; and
a video signal line, wherein
the gate electrode of the third transistor is connected to the
write control scanning line,
the write control scanning line writes a control signal to
the gate electrode of the third transistor,
the source electrode of the third transistor is connected to
the video signal line,
the video signal line writes a video signal to the source
electrode of the third transistor, and
the third transistor writes a voltage corresponding to a
luminance of the light-emitting element to the gate
electrode of the first transistor.

12. The display device according to claim 11, wherein
the first transistor is connected in series with the light-
emitting element and the second transistor between the
high potential power source and the low potential
power source, and
the first transistor controls a current value flowing to the
light-emitting element.

13. The display device according to claim 12, further
comprising:
a reset control scanning line; and
a reset power source line,
wherein
the gate electrode of the fourth transistor is connected to
the reset control scanning line,
a control signal from the reset control scanning line
switches the fourth transistor between an ON state and
an OFF state,
the source electrode of the fourth transistor is connected
to the reset power source line,
the reset power source line is fixed to a reset potential, and
a potential of the drain electrode of the first transistor is
initialized when the fourth transistor is turned ON.

14. The display device according to claim 13, further
comprising:
an initialization scanning line;
an initialization signal line; and
a fifth transistor including a source electrode, a drain
electrode and a gate electrode,
the drain electrode of the fifth transistor being connected
to the gate electrode of the first transistor, the drain
electrode of the third transistor and the holding capaci-
tor,
the source electrode of the fifth transistor being connected
to the initialization signal line, and
the gate electrode of the fifth transistor being connected to
the initialization scanning line,
wherein
a control signal from the initialization scanning line
switches the fifth transistor between an ON state and an
OFF state,
the gate electrode of the first transistor is fixed to an
initialization potential through the fifth transistor when
the fifth transistor is turned ON.

15. The display device according to claim 7, wherein
the first transistor and the second transistor control a
current flowing to the light-emitting element.

16. A display device comprising:
a light-emitting element;
a first transistor and a second transistor connected in
series between the light-emitting element and a driving
power line;
a third transistor electrically connected to a gate electrode
of the first transistor; and a fourth transistor connected in parallel between a drain electrode of the first transistor and the light-emitting element, wherein a ratio of a channel width W1 to a channel length L1 of the first transistor (a W1/L1 ratio) and a ratio of a channel width W2 to a channel length L2 of the second transistor (a W2/L2 ratio) are larger than a ratio of a channel width W3 to a channel length L3 of the third transistor (a W3/L3 ratio) and a ratio of a channel width W4 to a channel length L4 of the fourth transistor (a W4/L4 ratio), and the first transistor and the second transistor control a current flowing to the light-emitting element.

17. The display device according to claim 16, wherein the first transistor, the second transistor, the third transistor and the fourth transistor are formed of oxide semiconductor.

18. The display device according to claim 17, wherein the first transistor controls a current value flowing to the light-emitting element, and the second transistor controls an emission time of the light-emitting element.

19. The display device according to claim 18, wherein the third transistor writes a voltage corresponding to a luminance of the light-emitting element to a gate electrode of the first transistor, and the fourth transistor initializes a potential of the drain electrode of the first transistor to a predetermined potential.

20. The display device according to claim 19, further comprising:

a fifth transistor electrically connected to the gate electrode of the first transistor, wherein the W1/L1 ratio of the first transistor is larger than a ratio of a channel width W5 to a channel length L5 of the fifth transistor (a W5/L5 ratio), the fifth transistor is formed of oxide semiconductor, and the fifth transistor fixes a potential of the gate electrode of the first transistor to a predetermined potential.

* * * * *